US008872193B2

(12) United States Patent
Tega et al.

(10) Patent No.: US 8,872,193 B2
(45) Date of Patent: Oct. 28, 2014

(54) SILICON CARBIDE SEMICONDUCTOR DEVICE AND METHOD FOR PRODUCING THE SAME

(71) Applicant: Hitachi, Ltd., Tokyo (JP)

(72) Inventors: Naoki Tega, Kunitachi (JP); Digh Hisamoto, Kokobunji (JP); Takashi Takahama, Higashimurayama (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 13/890,315

(22) Filed: May 9, 2013

(65) Prior Publication Data
US 2013/0299849 A1 Nov. 14, 2013

(30) Foreign Application Priority Data

May 11, 2012 (JP) ................................. 2012-109315

(51) Int. Cl.
H01L 29/15 (2006.01)
H01L 29/66 (2006.01)
H01L 29/06 (2006.01)
H01L 29/16 (2006.01)

(52) U.S. Cl.
CPC ...... H01L 29/0607 (2013.01); H01L 29/66666 (2013.01); H01L 29/1608 (2013.01)
USPC ............... 257/77; 257/E21.054; 257/E21.065

(58) Field of Classification Search
USPC .............................. 257/77, E21.054, E21.065
See application file for complete search history.

(56) References Cited

U.S. PATENT DOCUMENTS

| 6,455,892 | B1 * | 9/2002 | Okuno et al. ................. 257/328 |
| 7,915,617 | B2 | 3/2011 | Ogura et al. |
| 2008/0102585 | A1 * | 5/2008 | Nakamura et al. ............ 438/285 |
| 2012/0280255 | A1 * | 11/2012 | Masuda et al. .................. 257/77 |

FOREIGN PATENT DOCUMENTS

| JP | 2001-094097 A | 4/2001 |
| JP | 2007-013058 A | 1/2007 |

OTHER PUBLICATIONS

Afanasev, V.V., et al., "Intrinsic SiC/SiO$_2$ Interface States", Phys. Stat. Sol. (a) 162, (1997), pp. 321-337.
Harada, Shinsuke, et al., "High Channel Mobility in Normally-Off 4H-SiC Buried Channel MOSFETs", IEEE Electron Device Letters, vol. 22, No. 6, Jun. 2001, pp. 272-274.

* cited by examiner

Primary Examiner — Timor Karimy
(74) Attorney, Agent, or Firm — Miles & Stockbridge P.C.

(57) ABSTRACT

The present invention provides a technique capable of realizing a silicon carbide semiconductor device having high performance and high reliability. By constituting a channel region by an n$^-$-type, intrinsic, or p$^-$-type channel region and a p$^+$-type channel region, a high channel mobility and a high threshold voltage are realized. Further, by constituting a source region by an n$^+$-type source region and an n$^{++}$-type source region, and forming the n$^+$-type source region between the p$^+$-type channel region and the n$^{++}$-type source region, an electric field in the p$^+$-type channel region is relaxed to suppress deterioration of a gate insulating film, and also by electrically connecting a source wiring electrode to the n$^{++}$-type source region, a contact resistance is decreased.

9 Claims, 31 Drawing Sheets

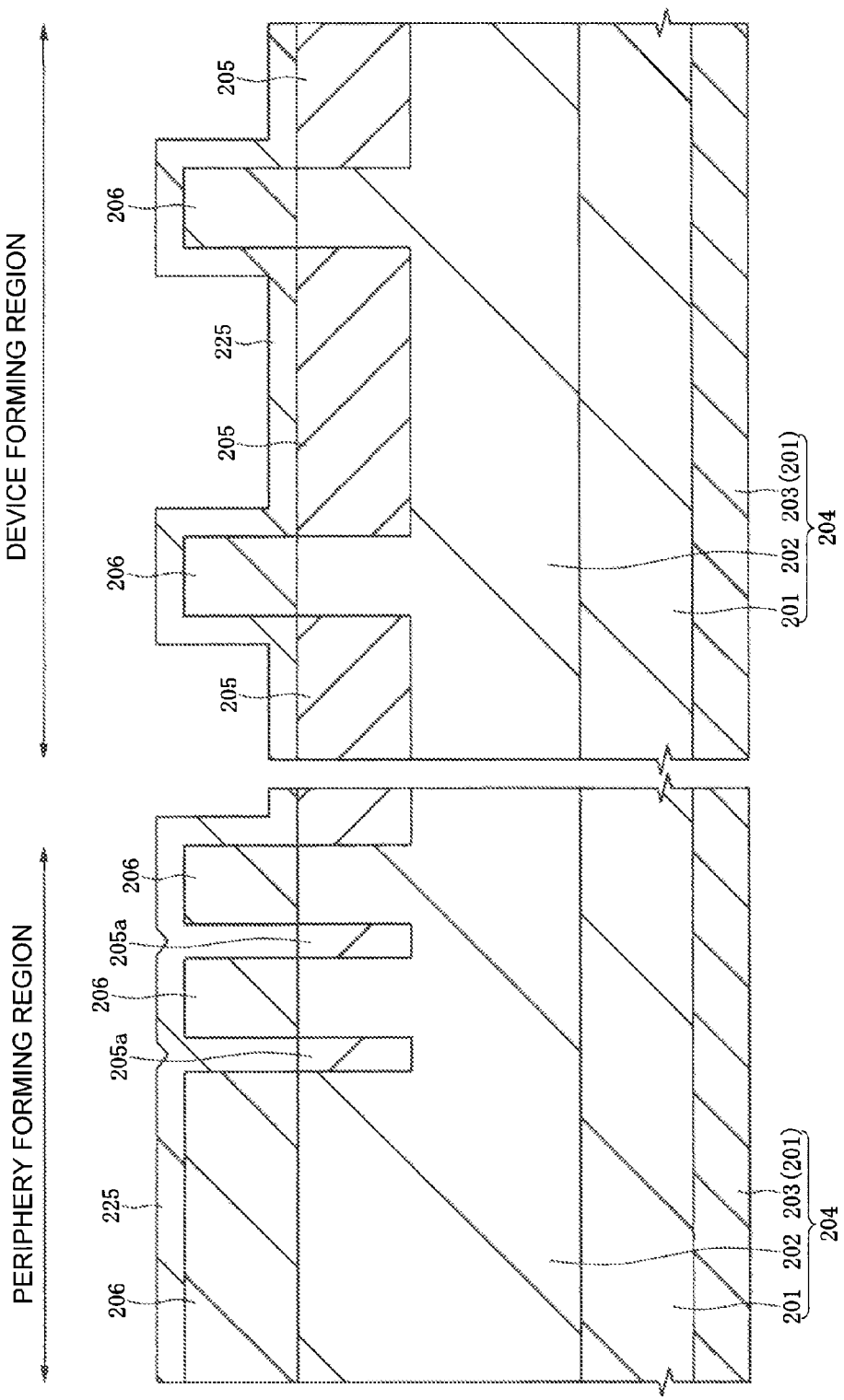

SILICON CARBIDE SEMICONDUCTOR DEVICE AND METHOD FOR PRODUCING THE SAME

BACKGROUND OF THE INVENTION

1. Field of the Invention

The present invention relates to a semiconductor device and a technique for producing the same, and particularly relates to a silicon carbide semiconductor device constituted by a plurality of power semiconductor devices using a silicon carbide substrate and a technique which is effective by being applied to the production thereof.

2. Background Art

As a power metal insulator semiconductor field effect transistor (MISFET), which is one of the power semiconductor devices, a power MISFET using a silicon (Si) substrate (hereinafter referred to as "Si power MISFET") was most commonly used in the past.

However, a power MISFET using a silicon carbide (SiC) substrate (hereinafter referred to as "SiC substrate") (hereinafter referred to as "SiC power MISFET") can increase pressure resistance and reduce loss as compared with a Si power MISFET. Therefore, a SiC power MISFET has been attracting attention particularly in the field of technology.

A SiC power MISFET can decrease an on-resistance as compared with a Si power MISFET in the case where the pressure resistance is equivalent. This is attributed to the fact that silicon carbide (SiC) has a high dielectric breakdown field strength, which is about 7 times as high as that of silicone (Si), and therefore the thickness of an epitaxial layer serving as a drift layer can be decreased. However, in consideration of the original property which should be obtained from silicon carbide (SiC), a sufficient property has not yet to be obtained, and from the viewpoint of highly efficient utilization of energy, a further reduction in on-resistance has been demanded.

One problem to be solved with respect to the on-resistance of a SiC power MISFET is a low channel mobility, which is a problem specific to a SiC power MISFET. In a parasitic resistance component of a SIC power MISFET having a DMOS (Double diffused Metal Oxide Semiconductor) structure, a channel resistance component has the highest proportion, and the channel mobility of a Si power MISFET is, for example, about 300 $cm^2$/Vs, however, the channel mobility of a SiC power MISFET is about several square centimeters per volt second, which is extremely low.

One of the causes of this low channel mobility is considered to be, for example, as described in V. V. Afanasev et al., "Intrinsic SiC/$SiO_2$ Interface States", Physica status solidi (a) 162, 321 (1997) (NPL 1), an effect of an interface state at an interface between a SiC substrate and a gate insulating film or an effect of carbon (C) present at an interface between a SiC substrate and a silicon oxide ($SiO_2$) film when a surface of the SiC substrate is oxidized. Such a scattering factor scatters a carrier to deteriorate the channel mobility.

As a method for suppressing the deterioration of the channel mobility, for example, as described in S. Harada et al "High Channel Mobility in Normally-off 4H—SiC Buried Channel MOSFETs", IEEE Electron Device Letters 22, 272 (2001) (NPL 2), there is a method of using an embedded channel to form a channel at a position deeper than such a scattering factor present at an interface between a SiC substrate and a gate insulating film. By disposing the channel spaced apart from such a scattering factor, the improvement of the channel mobility can be expected.

However, in the case of using an embedded channel, since a distance between the channel and the gate electrode is increased, it becomes difficult for a gate voltage to influence the channel. Therefore, a threshold voltage (Vth) of a SiC power MISFET in which an embedded channel is used is lower than that of a SiC power MISFET in which an embedded channel is not used. Due to this, a SiC power MISFET in which an embedded channel is used exhibits normally-on characteristics. Further, even if it is a normally-off type SiC power MISFET, it has a problem of low threshold voltage, for example, a high threshold voltage which is sufficient so as not to cause malfunction cannot be obtained, etc.

Accordingly, a technique for increasing a threshold voltage becomes important. For example, JP-A-2001-94097 (PTL 1) discloses a method for obtaining normally-off characteristics by forming a p-type channel layer in addition to an $n^+$-type embedded channel layer.

Further, for example, JP-A-2007-13058 (PTL 2) discloses a method for obtaining normally-off characteristics by forming a p-type channel layer in addition to an n-type embedded channel layer not only in a SiC power MOSFET having a DMOS structure, but also in a SiC power MOSFET having a trench structure. By forming a SiC power MOSFET having a trench structure in this manner, the channel mobility is increased to 100 $cm^2$/Vs, and therefore, the channel mobility can be increased as compared with a SiC power MOSFET having a DMOS structure.

Further, in a SiC power MISFET having a DMOS structure, in the case where a channel is formed by performing light exposure twice, i.e., by performing light exposure for forming a JFET (Junction Field Effect Transistor) region and light exposure for forming a source region, a problem arises that in the channels on both sides of the JFET region, due to misalignment, the length of one channel is shorter than that of the other channel. In the case where a channel length is decreased, this problem cannot be ignored, and for example, a shift of the threshold voltage or kink in the drain current-gate voltage characteristics is liable to occur.

However, in the case where a channel is formed by self-aligning, the above-described problem of misalignment caused by performing light exposure twice can be avoided, and with respect to a reduction in channel resistance, a reduction in channel length synonymous with improvement of channel mobility can be expected.

However, a SiC power MISFET having a DMOS structure still has various technical problems as described below even if an embedded channel and a p-type channel are used in combination, and a short channel is formed by self-aligning.

First, a problem in the case of using an embedded channel and a p-type channel in combination will be described.

An embedded channel is a technique in which a channel is formed at a position deeper than an interface between a SiC substrate and a gate insulating film by forming a $p^-$-type body layer including a region serving as a channel on a SiC substrate, and thereafter implanting an n-type impurity into a surface layer portion of the $p^-$-type body layer. In general, a p-type impurity, for example, an aluminum atom (Al) or a boron atom (B) is implanted into a SiC substrate, thereby forming a $p^-$-type body layer. Thereafter, an n-type impurity, for example, a nitrogen atom (N) or a phosphorus atom (P) is counter-implanted into a surface layer portion of the $p^-$-type body layer, thereby forming a counter layer exhibiting $p^-$-type, intrinsic, or $n^-$-type conductivity in the surface layer portion of the $p^-$-type body layer, whereby an embedded channel is formed.

By using this embedded channel and a p-type channel in combination, the channel mobility is improved and also a decrease in threshold voltage can be suppressed.

On the other hand, in a SiC power MISFET, a gate voltage is higher than a drain voltage in view of the nature of its operation, and therefore, an electric field in an end portion of a source region is increased. Due to this, a gate insulating film in an end portion of the source region is liable to be deteriorated. The deterioration of the gate insulating film in an end portion of the source region is liable to cause a variation in threshold voltage as compared with the other portions, and therefore, this generation of a high electric field in an end portion of a source region is one of the problems of a SiC power MISFET. In addition, when an embedded channel and a p-type channel are used in combination, the p-type channel having a high impurity concentration is in contact with the source region, and therefore, an electric field in an end portion of the source region is further increased, as a result, deterioration of the gate insulating film in an end portion of the source region becomes more prominent.

Next, a problem in the case of forming a short channel by self-aligning will be described.

As described above, the formation of a short channel by self-aligning has an advantage that a problem of misalignment caused by performing light exposure twice can be avoided in addition to an advantage that it is useful as a method for compensating the problem of low channel mobility. However, if the length of the channel is extremely decreased, a negative effect that the threshold voltage is decreased occurs.

SUMMARY OF THE INVENTION

An object of the present invention is to provide a technique capable of realizing a silicon carbide semiconductor device having high performance and high reliability.

The above and other objects and novel features of the present invention will be apparent from the description of the present specification and the accompanying drawings.

An embodiment of typical aspects of the invention disclosed in the present application will be briefly described below.

An embodiment of the present invention is a SiC power MISFET in which a p-type body layer is formed on an n-type epitaxial layer formed on a front surface side of a substrate, a source region and a channel region are formed in the p-type body layer, a gate insulating film is formed in contact with the channel region, a gate electrode is formed in contact with the gate insulating film, and an n-type drain region is formed on a back surface side of the substrate. The source region is constituted by an n-type first source region having a relatively high impurity concentration and an n-type second source region having a relatively low impurity concentration. Further, the channel region is in contact with the second source region, and is constituted by a p-type first channel region having a relatively high impurity concentration and an n-type, intrinsic, or p-type second channel region having a relatively low impurity concentration located between an end portion of the body layer and the first channel region.

An embodiment of the present invention is a method for producing a SiC power MISFET including the following steps. An n-type epitaxial layer is formed on a front surface side of a substrate, and an n-type drain region is formed on a back surface side of the substrate. After a p-type body layer having a first depth from a surface of the epitaxial layer is formed in the epitaxial layer, an n-type impurity is implanted into the body layer using a first mask, thereby forming a second source region having a second depth from the surface of the epitaxial layer, and then, a p-type impurity is implanted into the body layer using the first mask, thereby forming a first channel region so as to surround a side surface of the second source region. Subsequently, an n-type impurity is implanted into the body layer using a second mask composed of the first mask and a side wall formed on a side surface of the first mask, thereby forming a first source region having a third depth from the surface of the epitaxial layer. Subsequently, an n-type or p-type impurity is ion-implanted between an end portion of the body layer and the first channel region, thereby forming a second channel region having a fourth depth from the surface of the epitaxial layer.

The effects obtained by an embodiment of typical aspects of the invention disclosed in the present application will be briefly described below.

A silicon carbide semiconductor device having high performance and high reliability can be realized.

BRIEF DESCRIPTION OF THE DRAWINGS

FIG. 17A is an enlarged cross-sectional view of a principal portion showing a part of the SiC power MISFET of FIG. 2, and FIG. 17B is an enlarged cross-sectional view of a principal portion showing a part of a modification example of the SiC power MISFET.

FIG. 18 is a cross-sectional view of a principal portion of a silicon carbide semiconductor device for explaining a process for producing a silicon carbide semiconductor device according to a second embodiment of the invention.

DESCRIPTION OF THE PREFERRED EMBODIMENTS

Figure 1:
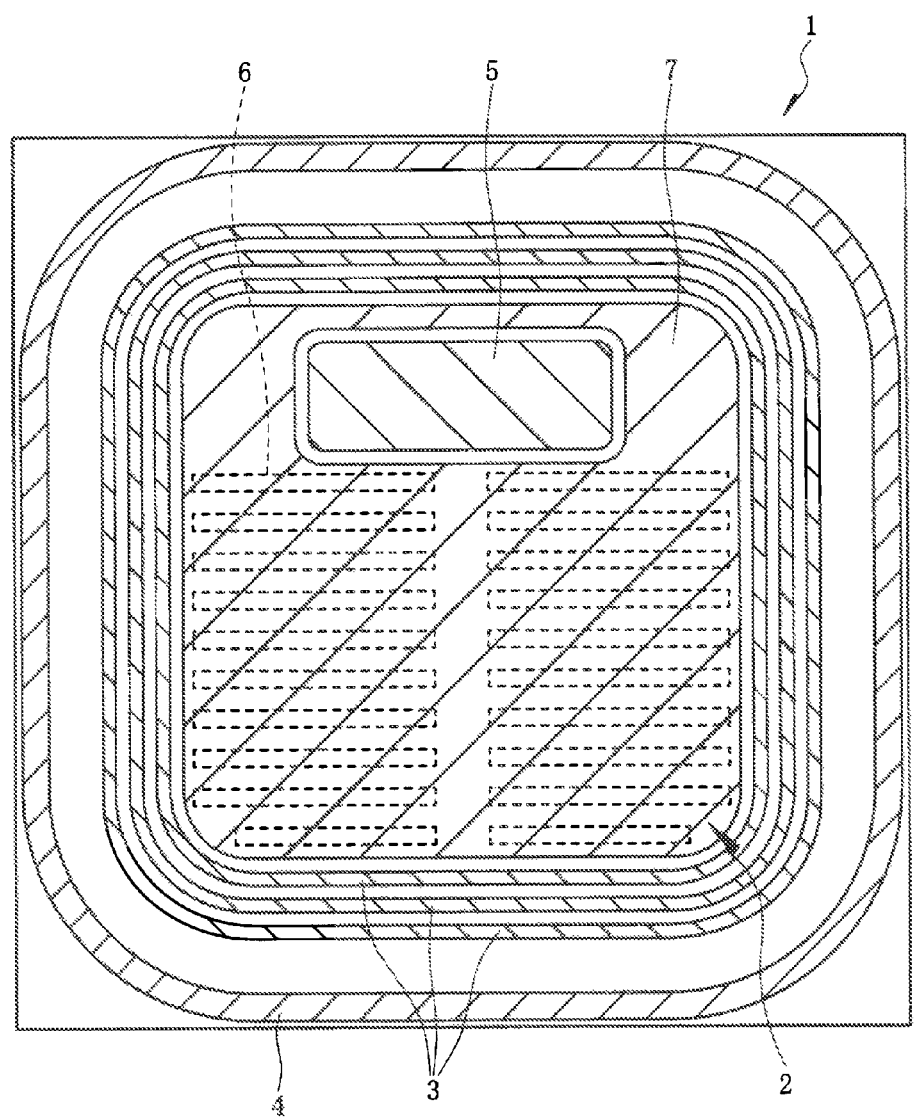
FIG. 1 is a top view of a principal portion of a semiconductor chip mounted with a silicon carbide semiconductor device constituted by a plurality of SiC power MISFETs according to a first embodiment of the invention.

In the embodiments described below, the present invention will be described by being divided into a plurality of sections or embodiments when required as a matter of convenience. However, these sections or embodiments are not irrelevant to each other unless otherwise explicitly stated, and the one relates to the entire or a part of the other as a modification example, details, a supplementary explanation thereof, or the like.

Also, in the embodiments described below, when referring to the number of elements (including number of pieces, numerical value, amount, range, etc.), the number of the elements is not limited to a specific number unless otherwise explicitly stated or except the case where the number is apparently limited to a specific number in principle, and a number larger or smaller than the specific number is also applicable. Further, in the embodiments described below, it goes without saying that the components (including element steps, etc.) are not always indispensable unless otherwise explicitly stated or except the case where it is conceivable that the components are apparently indispensable in principle. Similarly, in the embodiments described below, when the shape of the components, positional relationship thereof, and the like are mentioned, shapes substantially approximate or similar thereto and the like are included therein unless otherwise explicitly stated or except the case where it is conceivable that they are apparently excluded in principle. The same goes for the numerical value and the range described above.

Also, in some drawings used in the embodiments described below, hatching is used even in a plan view so as to make the drawings easy to see. Further, components having the same function are denoted by the same reference numerals in principle in all drawings for explaining the embodiments described below, and the repetitive explanation thereof is omitted. Hereinafter, the embodiments of the present invention will be described in detail based on the drawings.

First Embodiment

Silicon Carbide Semiconductor Device

Figure 2:
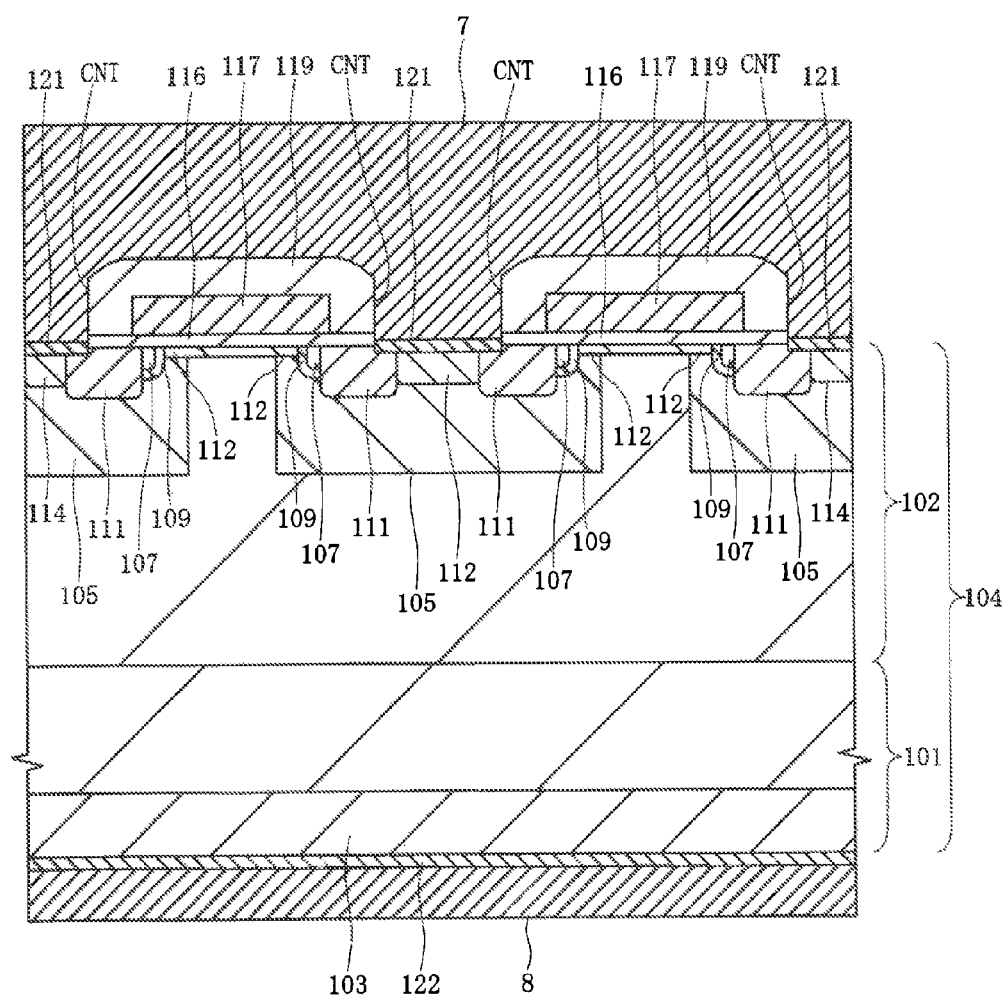
FIG. 2 is a cross-sectional view of a principal portion of the SiC power MISFET according to the first embodiment of the invention.

A structure of a silicon carbide semiconductor device according to a first embodiment of the invention will be described with reference to FIGS. 1 and 2. FIG. 1 is a top view of a principal portion of a semiconductor chip mounted with a silicon carbide semiconductor device constituted by a plurality of SiC power MISFETs, and FIG. 2 is a cross-sectional view of a principal portion of the SiC power MISFET. The SiC power MISFET constituting the silicon carbide semiconductor device is an MISFET having a DMOS structure.

As shown in FIG. 1, a semiconductor chip 1 mounted with a silicon carbide semiconductor device is constituted by an active region (a SiC power MISFET forming region or a device forming region) 2, in which a plurality of channel Sic power MISFETs are connected in parallel with one another, and a periphery forming region that surrounds the active region 2 in plan view. In the periphery forming region, a plurality of p-type floating field limiting rings (FLRs) 3 formed so as to surround the active region 2 in plan view, and an n-type guard ring 4 formed so as to surround the plurality of p-type floating field limiting rings 3 in plan view are formed.

On a front surface side of the active region of an n-type silicon carbide (SIC) epitaxial substrate (hereinafter referred to as "SiC epitaxial substrate"), a gate electrode, an $n^+$-type source region, a channel region, etc. of the SiC power MISFET are formed, and on a back surface side of the SiC epitaxial substrate, an $n^+$-type drain region of the SiC power MISFET is formed.

By forming the plurality of p-type floating field limiting rings 3 on a periphery of the active region 2, when the power is turned off, the maximum electric field is sequentially shifted toward the outer side of the p-type floating field limiting ring 3, and breaks down when reaching the p-type floating field limiting ring 3 located at the outermost periphery, and therefore, it becomes possible to form a silicon carbide semiconductor device having high pressure resistance. In FIG. 1, an example in which three p-type floating field limiting rings 3 are formed is shown, however, the number of the p-type floating field limiting rings 3 is not limited thereto. Further, the n-type guard ring 4 has a function of protecting the SiC power MISFETs formed in the active region 2.

The respective gate electrodes of the plurality of SiC power MISFETs formed in the active region 2 are connected to one another and each form a stripe pattern in plan view. By an extraction wiring (gate bus line) connected to each stripe pattern, all of the gate electrodes of the SiC power MISFETs are electrically connected to a gate wiring electrode 5. Here, the gate electrode is formed into a stripe pattern, however, the pattern is not limited thereto, and may be, for example, a box pattern, a polygonal pattern, etc.

Further, the respective source regions of the plurality of SiC power MISFETs are each electrically connected to a source wiring electrode 7 through an opening 6 formed in an interlayer insulating film that covers the plurality of SiC power MISFETs. The gate wiring electrode 5 and the source wiring electrode 7 are formed spaced apart from each other, and the source wiring electrode 7 is formed on an almost entire surface of the active region 2 except for a region where the gate wiring electrode 5 is formed. Further, the $n^+$-type drain region formed on the back surface side of the n-type SiC epitaxial substrate is electrically connected to a drain wiring electrode formed on the entire back surface of the n-type SiC epitaxial substrate.

Next, a structure of the SiC power MISFET according to the first embodiment will be described with reference to FIG. 2.

On a front surface (first principal surface) of an $n^+$-type SiC substrate (substrate) 101 composed of silicon carbide (SiC), an $n^+$-type epitaxial layer 102 composed of silicon carbide (SiC) having an impurity concentration lower than the $n^-$-type SiC substrate 101 is formed, and a SIC epitaxial substrate 104 is constituted by the $n^+$-type SiC substrate 101 and the $n^-$-type epitaxial layer 102. The thickness of the $n^-$-type epitaxial layer 102 is, for example, about 5 to 20 μm.

A p-type body layer (well region) 105 is formed in the $n^-$-type epitaxial layer 102 such that it has a predetermined depth from the surface of the $n^-$-type epitaxial layer 102. Further, a source region composed of an $n^+$-type source region (second source region) 107 and an $n^{++}$-type source region (first source region) 111 is formed in the p-type body layer 105 such that it has a predetermined depth from the surface of the $n^-$-type epitaxial layer 102.

The depth (first depth) of the p-type body layer 105 from the surface of the epitaxial layer 102 is, for example, about 0.5 to 2.0 μm. Further, the depth (second depth) of the $n^+$-type source region 107 from the surface of the epitaxial layer 102 is, for example, about 0.01 to 0.2 μm. On the other hand, the depth (third depth) of the $n^{++}$-type source region 111 from the surface of the epitaxial layer 102 is, for example, about 0.1 to 0.4 μm.

That is, the source region is formed in the p-type body layer 105 spaced apart from an end portion of the p-type body layer 105, and is composed of the $n^+$-type source region 107 having the second depth and the $n^{++}$-type source region 111 having the third depth. The $n^+$-type source region 107 is formed in contact with the $n^{++}$-type source region 111 between an end portion in plan view of the p-type body layer 105 and the $n^{++}$-type source region 111 spaced apart from the end portion in plan view of the p-type body layer 105.

Further, a channel region composed of an $n^-$-type, intrinsic, or $p^-$-type channel region (second channel region) 112 and a $p^+$-type channel region (first channel region) 109 is formed in the p-type body layer 105 such that it has a predetermined depth from the surface of the $n^-$-type epitaxial layer 102.

The depth (fourth depth) of the $n^-$-type, intrinsic, or $p^-$-type channel region 112 from the surface of the epitaxial layer 102 is, for example, about 0.05 to 0.2 μm. On the other hand, the depth (fifth depth) of the $p^+$-type channel region 109 from the surface of the epitaxial layer 102 is, for example, about 0.05 to 0.2 μm.

That is, the channel region is formed in the p-type body layer 105 between an end portion in plan view of the p-type body layer 105 and the source region, and is constituted by the $n^-$-type, intrinsic, or $p^-$-type channel region 112 having the fourth depth and the $p^+$-type channel region 109 having the fifth depth. The $p^+$-type channel region 109 is formed in contact with the $n^+$-type source region 107 between an end portion in plan view of the p-type body layer 105 and the $n^+$-type source region 107 spaced apart from the end portion in plan view of the p-type body layer 105. Further, the $n^-$-type, intrinsic, or $p^-$-type channel region 112 is formed in contact with the $p^+$-type channel region 109 between an end portion in plan view of the p-type body layer 105 and the $p^+$-type channel region 109.

Further, a $p^{++}$-type potential fixing layer 114 that fixes a potential of the p-type body layer 105 is formed in the p-type body layer 105 such that it has a predetermined depth from the surface of the $n^-$-type epitaxial layer 102. The depth (seventh depth) of the $p^{++}$-type potential fixing layer 114 from the surface of the epitaxial layer 102 is, for example, about 0.05 to 0.2 μm. Further, an $n^+$-type drain region 103 is formed such that it has a predetermined depth (sixth depth) from a back surface (second principal surface) of the SiC substrate 101.

Incidentally, the symbols "−" and "+" denote a relative concentration of an impurity whose conductivity type is n-type or p-type, and for example, a concentration of an n-type impurity increases in the order of "$n^-$", "n", "$n^+$", and "$n^{++}$".

A preferred range of the impurity concentration in the $n^+$-type SIC substrate 101 is, for example, from $1 \times 10^{18}$ to $1\times10^{21}$ cm$^{-3}$, a preferred range of the impurity concentration in the n$^-$-type epitaxial layer 102 is, for example, from $1\times10^{14}$ to $1\times10^{17}$ cm$^{-3}$, and a preferred range of the impurity concentration in the p-type body layer 105 is, for example, from $1\times10^{16}$ to $1\times10^{19}$ cm$^{-3}$. Further, a preferred range of the impurity concentration in the n$^+$-type source region 107 is, for example, from $1\times10^{17}$ to $1\times10^{21}$ cm$^{-3}$, and a preferred range of the impurity concentration in the n$^{++}$-type source region 111 is, for example, from $1\times10^{18}$ to $1\times10^{21}$ cm$^{-3}$. The maximum impurity concentration in the n$^{++}$-type source region 111 is set to be 10 times or more higher than the maximum impurity concentration in the n$^+$-type source region 107.

Further, a preferred range of the impurity concentration in the p$^+$-type channel region 109 is, for example, from $1\times10^{16}$ to $1\times10^{19}$ cm$^{-3}$, and in the case where the channel region 112 has n$^-$-type conductivity, a preferred range of the impurity concentration in the n$^-$-type channel region 112 is, for example, from $1\times10^{16}$ to $1\times10^{19}$ cm$^{-3}$. The maximum impurity concentration in the p$^+$-type channel region 109 is set to be twice or more higher than the maximum impurity concentration in the n$^-$-type, intrinsic, or p$^-$-type channel region 112. A preferred range of the impurity concentration in the p$^{++}$-type potential fixing layer 114 is, for example, from $1\times10^{19}$ to $1\times10^{21}$ cm$^{-3}$.

On the p$^+$-type channel region 109 and the n$^-$-type, intrinsic, or p$^-$-type channel region 112, a gate insulating film 116 is formed, and on the gate insulating film 116, a gate electrode 117 is formed. The gate insulating film 116 and the gate electrode 117 are covered with an interlayer insulating film 119. Further, on a bottom surface of an opening CNT formed in the interlayer insulating film 119, a part of the n$^{++}$-type source region 111 and the p$^{++}$-type potential fixing layer 114 are exposed, and a metal silicide layer 121 is formed on surfaces of these exposed portions. Further, to the part of the n$^{++}$-type source region 111 and the p$^{++}$-type potential fixing layer 114, the source wiring electrode 7 is electrically connected through the metal silicide layer 121, and to the n$^+$-type drain region 103, the drain wiring electrode 8 is electrically connected through a metal silicide layer 122. Although not shown in the drawing, similarly, the gate electrode 117 is electrically connected to the gate wiring electrode. To the source wiring electrode 7, a source potential is applied from an external source, to the drain wiring electrode 8, a drain potential is applied from an external source, and to the gate wiring electrode, a gate potential is applied from an external source.

Next, a feature of a structure of the SiC power MISFET according to the first embodiment will be described with reference to FIG. 2.

As shown in FIG. 2, as the channel region, the n$^-$-type, intrinsic, or p$^-$-type channel region 112 and the p$^+$-type channel region 109 are formed, and as the source region, the n$^+$-type source region 107 and the n$^{++}$-type source region 111 are formed.

By forming the n$^-$-type, intrinsic, or p$^-$-type channel region 112, the channel mobility is increased, and therefore, a high transconductance can be expected. However, in the case where only the n$^-$-type, intrinsic, or p$^-$-type channel region 112 is formed, the threshold voltage is decreased, and an MISFET has a normally-on characteristic. Therefore, by further forming the p$^+$-type channel region 109 between the n$^-$-type, intrinsic, or p$^-$-type channel region 112 and the source region in contact with the n$^-$-type, intrinsic, or p$^-$-type channel region 112, the threshold voltage is increased.

In this manner, by constituting the channel region by the n$^-$-type, intrinsic, or p$^-$-type channel region 112 capable of realizing a high channel mobility and the p$^+$-type channel region 109 capable of realizing a high threshold voltage, both of a high channel mobility and a high threshold voltage can be realized in the SiC power MISFET.

However, when the p$^+$-type channel region 109 is provided, a high electric field region is generated between the p$^+$-type channel region 109 and an end portion of the source region. This high electric field region deteriorates the reliability of the gate insulating film 116, and therefore, it is necessary to decrease the impurity concentration in the source region. However, when the impurity concentration in the source region is decreased, a parasitic resistance (contact resistance) of a junction portion (contact portion) between the source wiring electrode 7 and the source region is increased.

Accordingly, the impurity concentration in a part of the source region (the n$^+$-type source region 107) in contact with the p$^+$-type channel region 109 is set relatively low, and the impurity concentration in the other part of the source region (the n$^{++}$-type source region 111) to which the source wiring electrode 7 is electrically connected is set relatively high. Further, on a surface of the other part of the source region (the n$^{++}$-type source region 111), the metal silicide layer 121 is formed.

In this manner, the impurity concentration in each of the n$^+$-type source region 107 and the n$^{++}$-type source region 111 is optimized by forming the n$^+$-type source region 107 in a part of the source region in contact with the p$^+$-type channel region 109, and forming the n$^{++}$-type source region 111 in the other part of the source region to which the source wiring electrode 7 is electrically connected. By forming the n$^+$-type source region 107 having a relatively low impurity concentration (e.g., from $1\times10^{17}$ to $1\times10^{21}$ cm$^{-3}$), the generation of a high electric field region in the p$^+$-type channel region 109 can be prevented. Further, by forming the n$^{++}$-type source region ill having a relatively high impurity concentration (e.g., from $1\times10^{18}$ to $1\times10^{21}$ cm$^{-3}$), the parasitic resistance of a junction portion between the source wiring electrode 7 and the source region can be decreased.

Method for Producing Silicon Carbide Semiconductor Device

A method for producing a silicon carbide semiconductor device according to the first embodiment of the invention will be described in the order of steps with reference to FIGS. 3 to 16. FIGS. 3 to 16 are each an enlarged cross-sectional view of a principal portion showing a part of a SiC power MISFET forming region (a device forming region) and a part of a periphery forming region of a silicon carbide semiconductor device. Incidentally, in the periphery forming region shown in each of FIGS. 3 to 16, two floating field limiting rings are shown.

Figure 3:
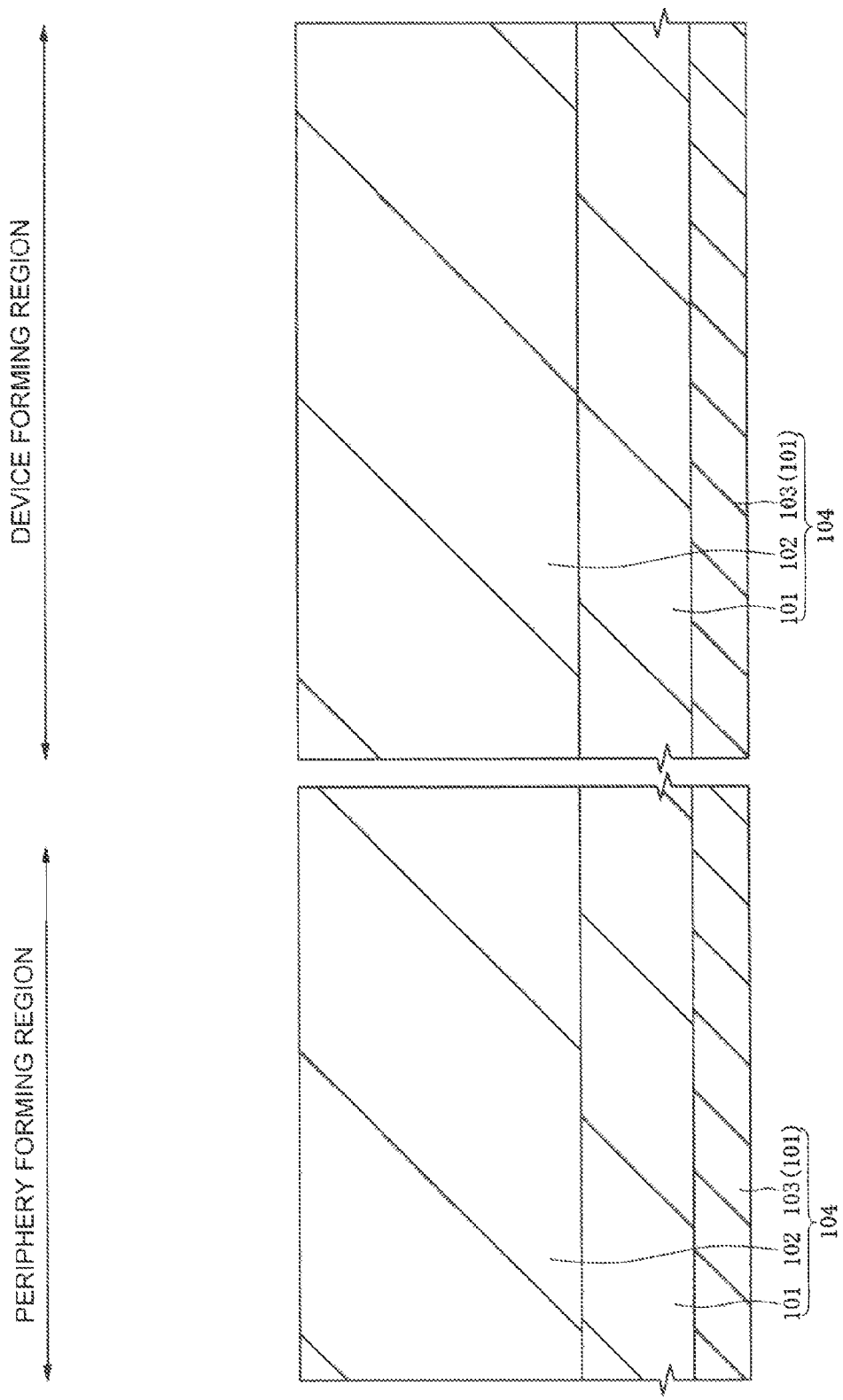
FIG. 3 is a cross-sectional view of a principal portion of a silicon carbide semiconductor device for explaining a process for producing the silicon carbide semiconductor device according to the first embodiment of the invention.

First, as shown in FIG. 3, an n$^+$-type 4H—SiC substrate 101 is prepared. Into the n$^+$-type SiC substrate 101, an n-type impurity has been introduced. This n-type impurity is, for example, nitrogen (N), and the impurity concentration of this n-type impurity is, for example, in a range from $1\times10^{18}$ to $1\times10^{21}$ cm$^{-3}$. The n$^+$-type SiC substrate 101 has two surfaces, i.e., a Si surface and a C surface, and the front surface of the n$^+$-type SiC substrate 101 may be either of the Si surface and the C surface.

Subsequently, on a front surface (first principal surface) of the n$^+$-type SiC substrate 101, an n$^-$-type epitaxial layer 102 composed of silicon carbide (SiC) is formed by an epitaxial growth method. Into the n$^-$-type epitaxial layer 102, an n-type impurity has been introduced at an impurity concentration lower than that in the n$^+$-type SiC substrate 101. The impurity concentration in the n$^-$-type epitaxial layer 102 depends on the device rating of the SiC power MISFET, but is, for example, in a range from $1\times10^{14}$ to $1\times10^{17}$ cm$^{-3}$. Further, the thickness of the n⁻-type epitaxial layer 102 is, for example, from 5 to 20 μm. By the above step, a SiC epitaxial substrate 104 composed of the n⁺-type SiC substrate 101 and the n⁻-type epitaxial layer 102 is formed.

Subsequently, an n⁺-type drain region 103 is formed on a back surface (second principal surface) of the n⁺-type SiC substrate 101 such that it has a predetermined depth (sixth depth) from the back surface of the n⁺-type SiC substrate 101. The impurity concentration in the n⁺-type drain region 103 is, for example, in a range from $1 \times 10^{19}$ to $1 \times 10^{21}$ cm⁻³.

Figure 4:
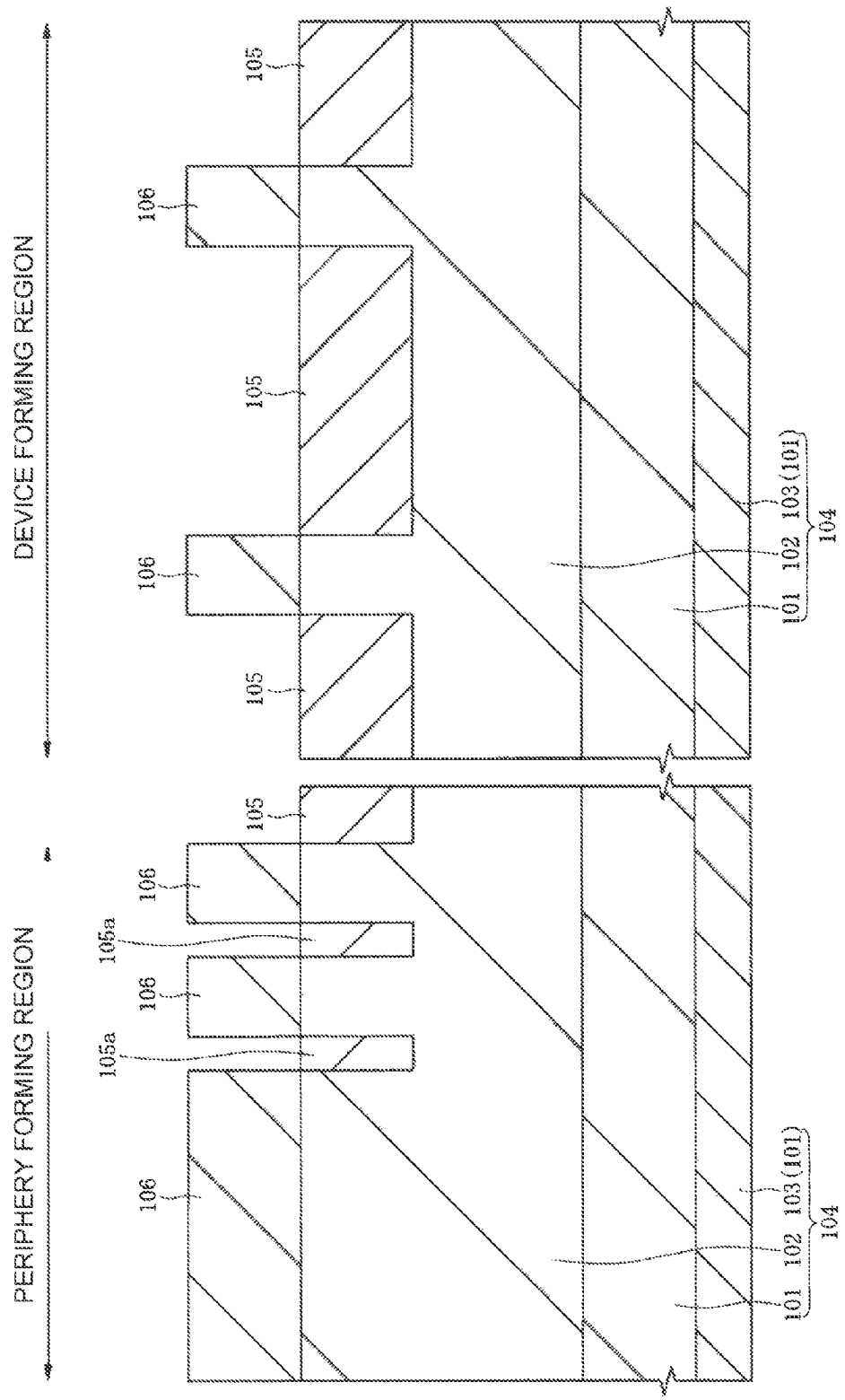
FIG. 4 is a cross-sectional view of a principal portion of the silicon carbide semiconductor device in the same place as in FIG. 3 in the process for producing the silicon carbide semiconductor device continued from FIG. 3.

Subsequently, as shown in FIG. 4, on a surface of the n⁻-type epitaxial layer 102, a mask 106 is formed. The thickness of the mask 106 is, for example, about 1.0 to 3.0 μm. The width of the mask 106 in the device forming region is, for example, about 1.0 to 5.0 μm.

Subsequently, a p-type impurity, for example, an aluminum atom (Al) is ion-implanted into the n⁻-type epitaxial layer 102 over the mask 106. By doing this, a p-type body layer 105 is formed in the device forming region of the n⁻-type epitaxial layer 102, and a p-type floating field limiting ring (hereinafter referred to as "ring") 105a is formed in the periphery forming region.

The depth (first depth) of the p-type body layer 105 and the p-type ring 105a from the surface of the epitaxial layer 102 is, for example, about 0.5 to 2.0 μm. Further, the impurity concentration in the p-type body layer 105 and the p-type ring 105a is, for example, in a range from $1 \times 10^{16}$ to $1 \times 10^{19}$ cm⁻³. Here, in the periphery forming region, the p-type ring 105 is formed, however, a structure of a terminal end portion is not particularly limited thereto, and for example, a junction termination extension (JTE) structure may be employed.

Figure 5:
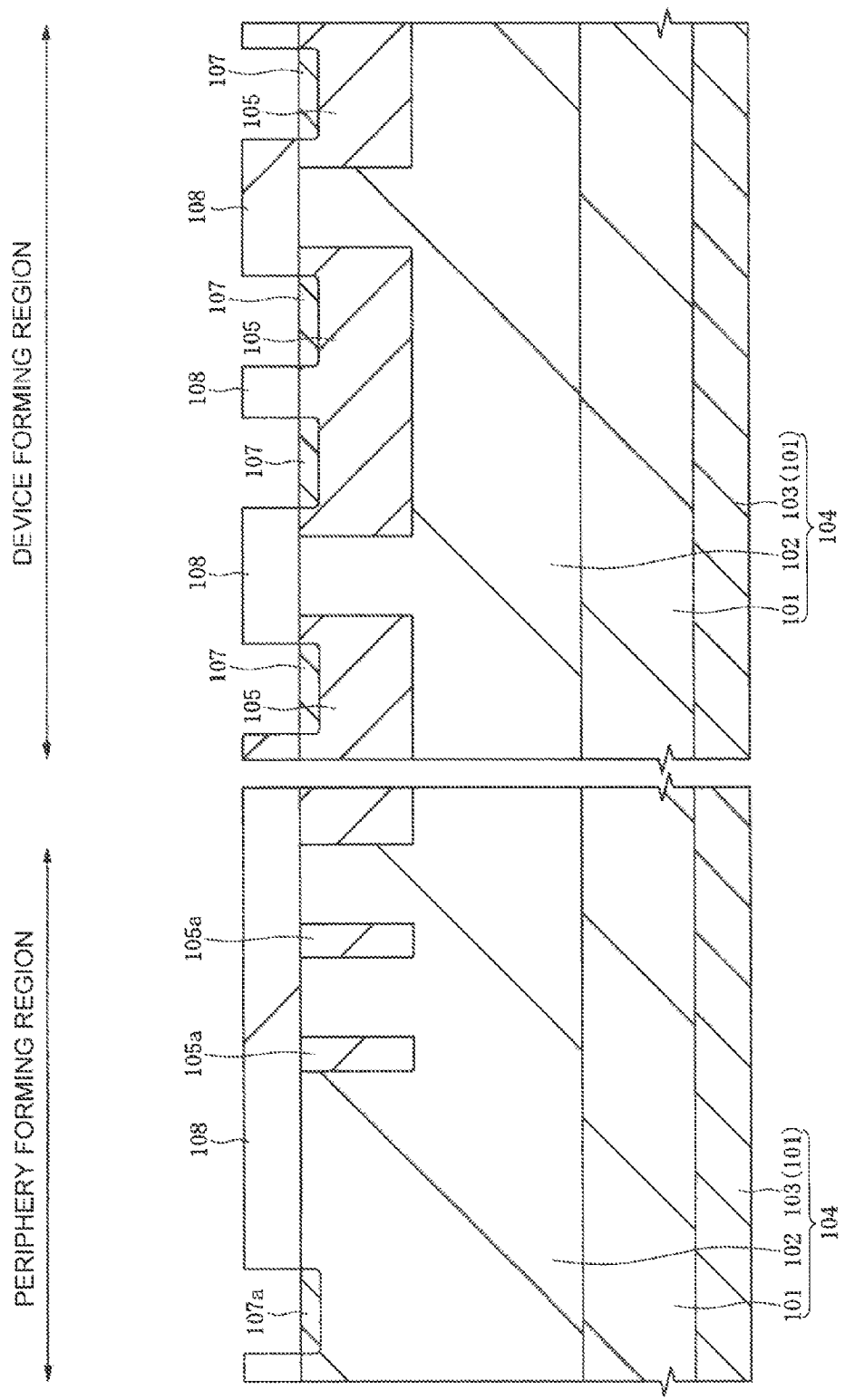
FIG. 5 is a cross-sectional view of a principal portion of the silicon carbide semiconductor device in the same place as in FIG. 3 in the process for producing the silicon carbide semiconductor device continued from FIG. 4.

Subsequently, as shown in FIG. 5, after the mask 106 removed, a mask (first mask) 108 is formed. The thickness of the mask 108 is, for example, about 0.5 to 1.0 μm. Further, an opening of the mask 108 is provided not only in the device forming region, but also in the periphery forming region.

Subsequently, an n-type impurity, for example, a nitrogen atom (N) or a phosphorus atom (P) is ion-implanted into the n⁻-type epitaxial layer 102 over the mask 108, whereby an n⁺-type source region 107 is formed in the device forming region, and an n⁺-type guard ring 107a is formed in the periphery forming region. The depth (second depth) of the n⁺-type source region 107 and the n⁺-type guard ring 107a from the surface of the epitaxial layer 102 is, for example, about 0.01 to 0.2 μm.

An example in which a nitrogen atom (N) or a phosphorus atom (P) is used as the n-type impurity to be ion-implanted into the n⁻-type epitaxial layer 102 is shown, however, any n-type impurity can be used as long as it is an n-type impurity, with which it is easy to form a shallow junction for decreasing the depth of the n⁺-type source region 107 from the surface of the epitaxial layer 102. For example, a nitrogen molecule ($N_2$), nitrogen fluoride (NF), nitrogen difluoride ($NF_2$), nitrogen trifluoride ($NF_3$), a phosphorus molecule ($P_2$), phosphine ($PH_3$), phosphorus fluoride (PF), phosphorus difluoride ($PF_2$), phosphorus trifluoride ($PF_3$) or a mixed gas of any of the above gas species can be used. The impurity concentration in the n⁺-type source region 107 is, for example, in a range from $1 \times 10^{17}$ to $1 \times 10^{21}$ cm⁻³.

Figure 6:
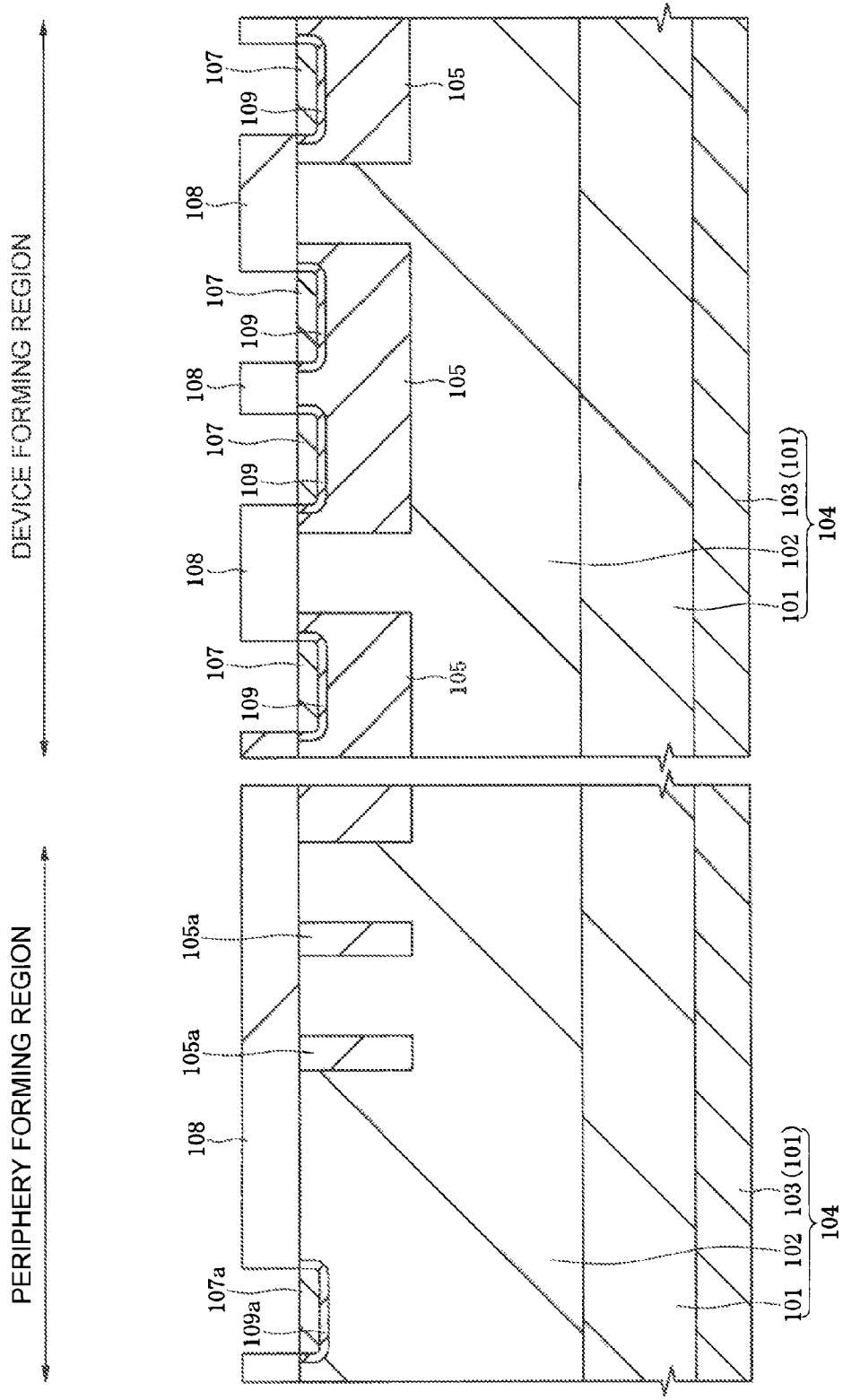
FIG. 6 is a cross-sectional view of a principal portion of the silicon carbide semiconductor device in the same place as in FIG. 3 in the process for producing the silicon carbide semiconductor device continued from FIG. 5.

Subsequently, as shown in FIG. 6, a p⁺-type channel region 109 is formed so as to surround a side surface and a lower surface (bottom surface) of the n⁺-type source region 107. For example, by obliquely ion-implanting a p-type impurity into the n⁻-type epitaxial layer 102 over the mask 108, the p⁺-type channel region 109 is formed. As the p-type impurity, aluminum (Al) can be used. The implantation angle is desirably about 10 to 45 degrees with respect to the normal line of the n⁺-type SiC substrate 101. The channel length of the p⁺-type channel region 109 is, for example, about 0.01 to 0.2 μm. The impurity concentration in the p⁺-type channel region 109 is, for example, in a range from $1 \times 10^{16}$ to $1 \times 10^{19}$ cm⁻³.

When the p⁺-type channel region 109 is formed in the device forming region, a p⁺-type channel region 109a is simultaneously formed so as to surround a side surface and a lower surface (bottom surface) of the n⁺-type guard ring 107a also in the periphery forming region.

Figure 7:
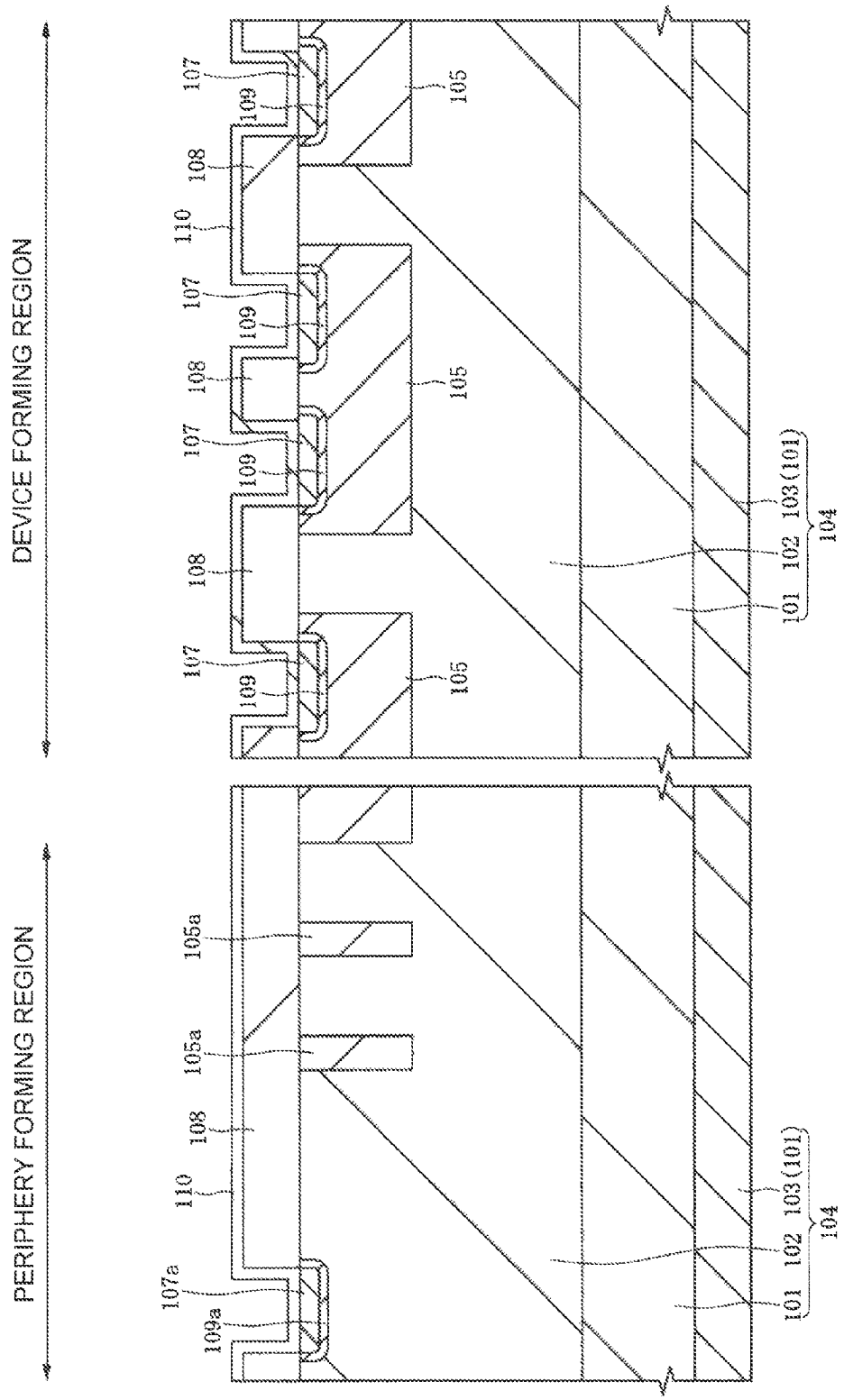
FIG. 7 is a cross-sectional view of a principal portion of the silicon carbide semiconductor device in the same place as in FIG. 3 in the process for producing the silicon carbide semiconductor device continued from FIG. 6.

Subsequently, as shown in FIG. 7, on a surface of the n⁻-type epitaxial layer 102, an insulating film (first insulating film) 110, for example, a silicon oxide ($SiO_2$) film is deposited so as to cover the mask 108 by, for example, a plasma CVD (Chemical Vapor Deposition) method. The thickness of the insulating film 110 defines the width of the n⁺-type source region 107. The thickness of the insulating film 110 is, for example, about 0.05 to 0.5 μm.

Figure 8:
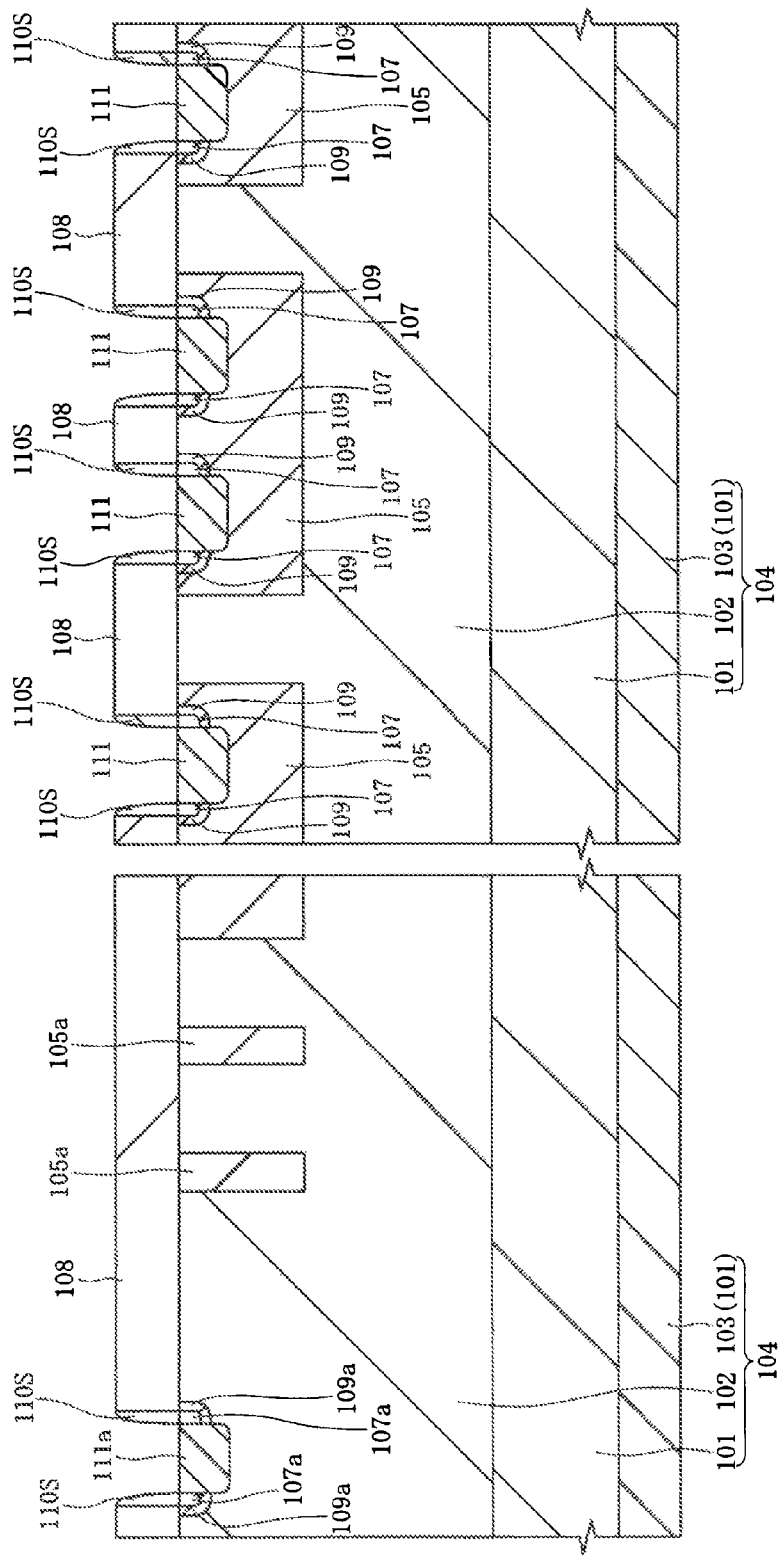
FIG. 8 is a cross-sectional view of a principal portion of the silicon carbide semiconductor device in the same place as in FIG. 3 in the process for producing the silicon carbide semiconductor device continued from FIG. 7.

Subsequently, as shown in FIG. 8, the insulating film 110 is processed by an anisotropic dry etching method, whereby a side wall 110S composed of the insulating film 110 is formed on a side surface of the mask 108. The width of the side wall 110S is equal to or smaller than the thickness of the insulating film 110. By forming this side wall 110S, the area in plan view of an n⁺⁺-type source region 111 to be formed in a later step can be made smaller than that of the n⁺-type source region 107.

Subsequently, an n-type impurity, for example, a nitrogen atom (N) or a phosphorus atom (P) is ion-implanted into the n⁻-type epitaxial layer 102 over a mask (second mask) composed of the mask 108 and the side wall 110S, thereby forming an n⁺⁺-type source region 111 in the device forming region. The depth (third depth) of the n⁺⁺-type source region 111 from the surface of the epitaxial layer 102 is, for example, about 0.1 to 0.4 μm. The impurity concentration in the n⁺⁺-type source region 111 is, for example, in a range from $1 \times 10^{18}$ to $1 \times 10^{21}$ cm⁻³.

When the n⁺⁺-type source region ill is formed in the device forming region, an n⁺⁺-type guard ring 111a is simultaneously formed also in the periphery forming region. The ion species to be ion-implanted when forming the n⁺⁺-type source region 111 may be the same as or different from that to be ion-implanted when forming the n⁺-type source region 107.

By undergoing the above steps, in the device forming region, a source region composed of the n⁺-type source region 107 and the n⁺⁺-type source region 111 and a part of a channel region composed of the p⁺-type channel region 109 are formed, and in the periphery forming region, a guard ring (the above-described n-type guard ring 4 shown in FIG. 1) composed of the n⁺-type guard ring 107a and the n⁺⁺-type guard ring 111a is formed.

In the first embodiment, the source region (the n⁺-type source region 107 and the n⁺⁺-type source region 111) in the device forming region and the guard ring (the n⁺-type guard ring 107a and the n⁺⁺-type guard ring 111a) in the periphery forming region are formed simultaneously, and therefore, the impurity distributions in the depth direction in both regions are the same as each other.

Figure 9:
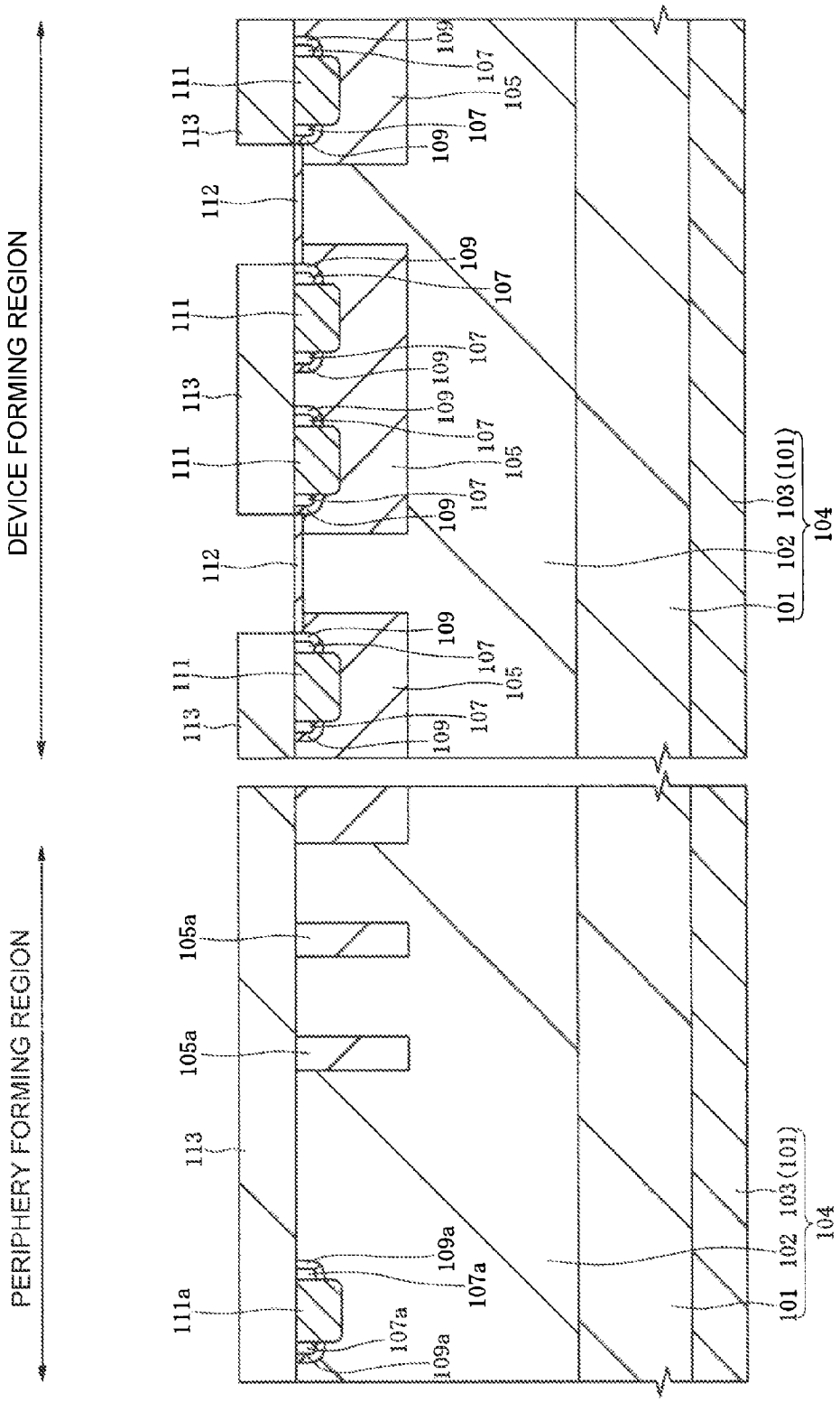
FIG. 9 is a cross-sectional view of a principal portion of the silicon carbide semiconductor device in the same place as in FIG. 3 in the process for producing the silicon carbide semiconductor device continued from FIG. 8.

Subsequently, as shown in FIG. 9, after the mask 108 and the side wall 110S are removed, a mask (third mask) 113 is formed. The mask 113 is provided with an opening only in a region where an n⁻-type, intrinsic, or p⁻-type channel region 112 is formed in a later step. The thickness of the mask 113 is, for example, about 0.2 to 1.0 μm.

Subsequently, an n-type impurity, for example, a nitrogen atom (N) or a phosphorus atom (P) is ion-implanted into the n⁻-type epitaxial layer 102 over the mask 113, thereby forming an n⁻-type channel region 112. The depth (fourth depth) of the n⁻-type channel region 112 from the surface of the epitaxial layer 102 is, for example, about 0.05 to 0.2 μm. The impurity concentration in the n⁻-type channel region 112 is, for example, in a range from $1\times10^{16}$ to $1\times10^{19}$ cm$^{-3}$.

Here, an example in which the n⁻-type channel region 112 is formed is shown, however, the channel region 112 does not necessarily have n⁻-type conductivity, and the conductivity depends on its device rating, and the channel region 112 may have intrinsic conductivity or p⁻-type conductivity.

Figure 10:
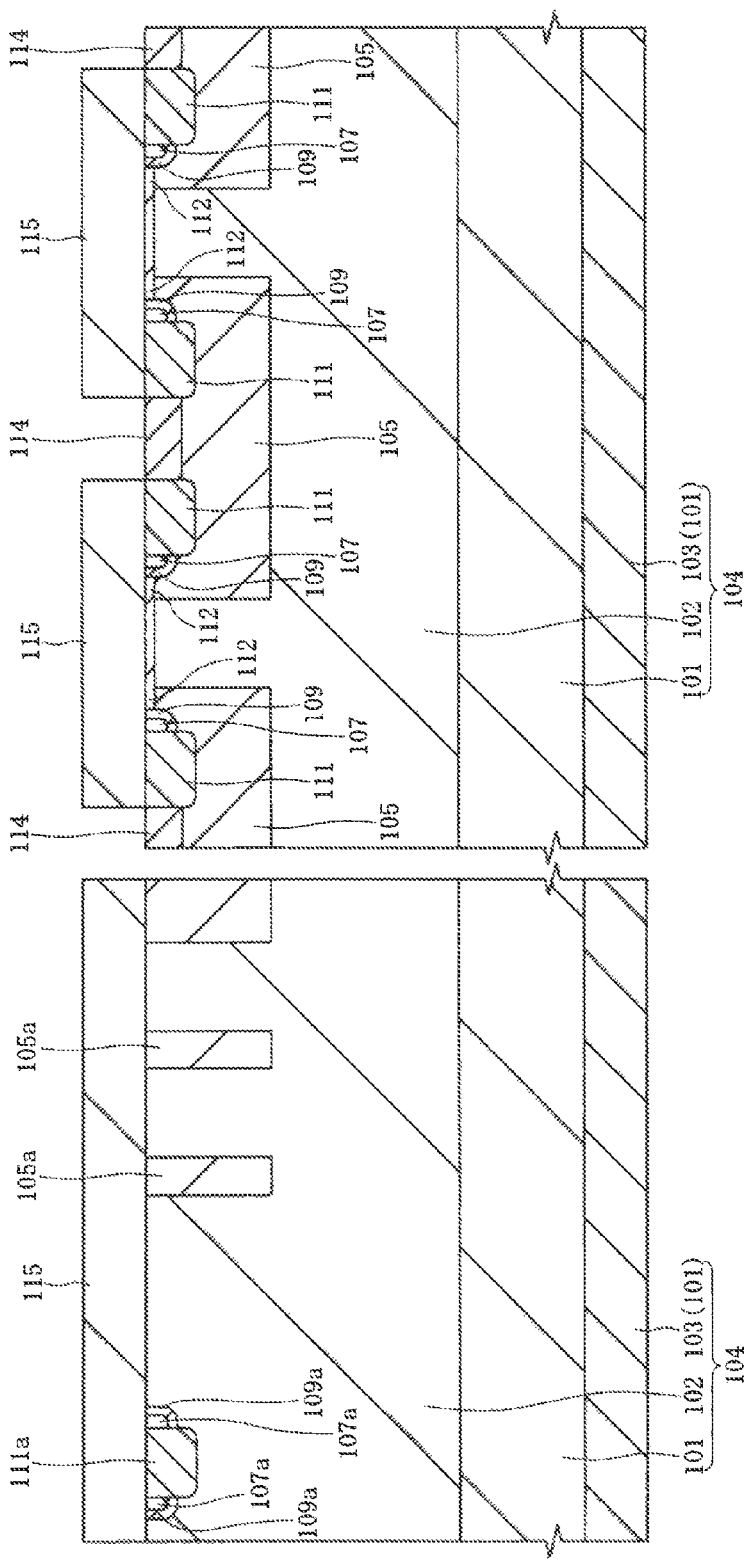
FIG. 10 is a cross-sectional view of a principal portion of the silicon carbide semiconductor device in the same place as in FIG. 3 in the process for producing the silicon carbide semiconductor device continued from FIG. 9.

Subsequently, as shown in FIG. 10, after the mask 113 is removed, a mask 115 is formed. The mask 115 is provided with an opening only in a region where a p⁺⁺-type potential fixing layer 114 that fixes a potential of the p-type body layer 105 is formed in a later step. The thickness of the mask 115 is, for example, about 0.2 to 1.0 μm.

Subsequently, a p-type impurity, for example, an aluminum atom (Al) is ion-implanted into the n⁻-type epitaxial layer 102 over the mask 115, thereby forming the p⁺⁺-type potential fixing layer 114. The depth (seventh depth) of the p⁺⁺-type potential fixing layer 114 from the surface of the epitaxial layer 102 is, for example, about 0.1 to 0.4 μm. The impurity concentration in the p⁺⁺-type potential fixing layer 114 is, for example, in a range from $1\times10^{19}$ to $1\times10^{21}$ cm$^{-3}$.

Subsequently, after the mask 115 is removed, although not shown in the drawing, on the front surface and the back surface of the SiC epitaxial substrate 104, a carbon (C) film is deposited by, for example, a plasma CVD method. The thickness of the carbon (C) film is, for example, about 0.03 μm. After the front surface and the back surface of the SiC epitaxial substrate 104 are covered with this carbon (C) film, the SiC epitaxial substrate 104 is subjected to a heat treatment at a temperature of 1500° C. or higher for about 2 to 3 minutes. By doing this, each impurity ion-implanted into the SiC epitaxial substrate 104 is activated. After the heat treatment, the carbon (C) film is removed by, for example, an oxygen plasma treatment.

Figure 11:
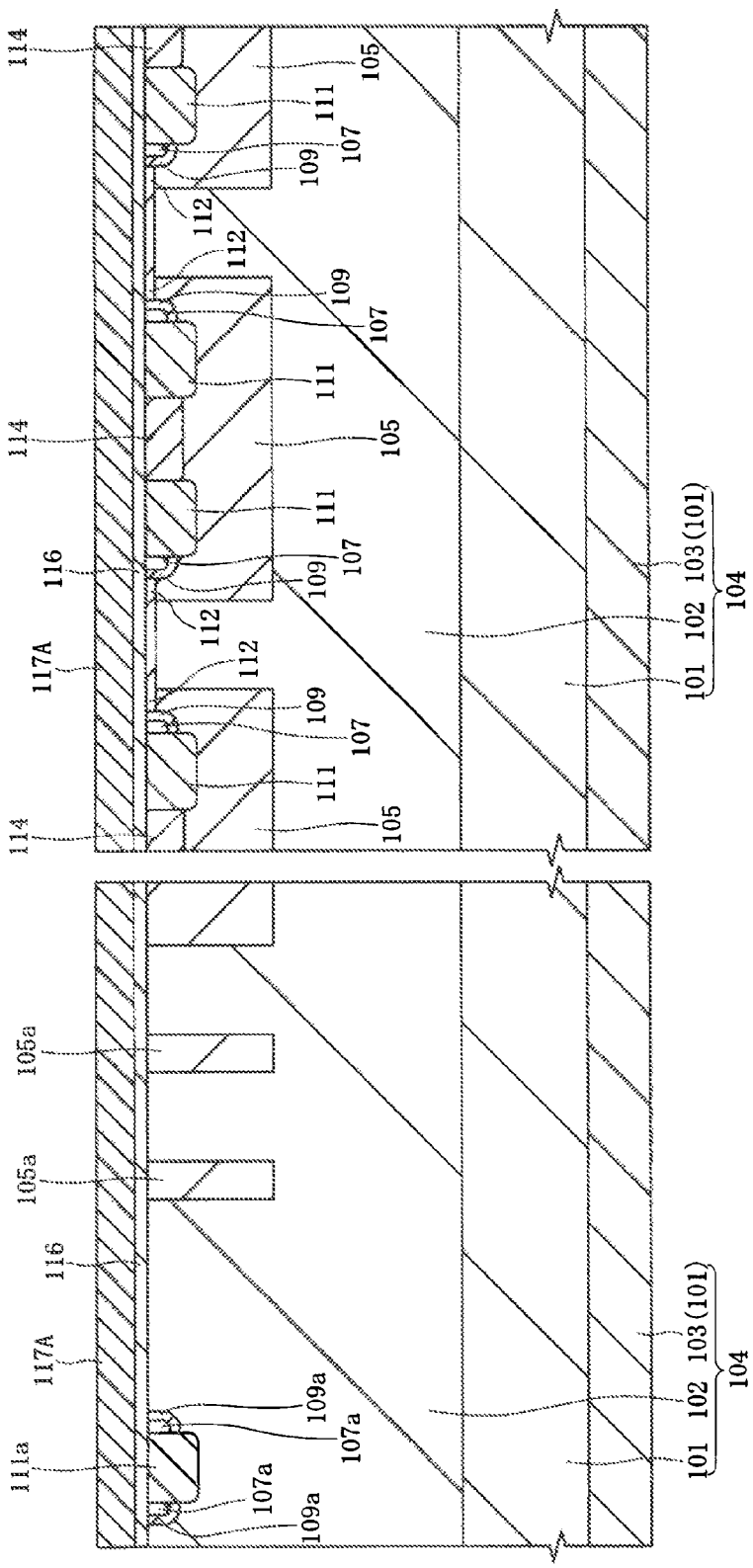
FIG. 11 is a cross-sectional view of a principal portion of the silicon carbide semiconductor device in the same place as in FIG. 3 in the process for producing the silicon carbide semiconductor device continued from FIG. 10.

Subsequently, as shown in FIG. 11, on a surface of the n⁻-type epitaxial layer 102, a gate insulating film 116 is formed. The gate insulating film 116 is composed of a silicon oxide (SiO₂) film formed by, for example, a thermal CVD method. The thickness of the gate insulating film 116 is, for example, about 0.05 to 0.15 μm.

Subsequently, on the gate insulating film 116, an n-type polycrystalline silicon (Si) film 117A is formed. The thickness of the n-type polycrystalline silicon (Si) film 117A is, for example, about 0.2 to 0.5 μm.

Figure 12:
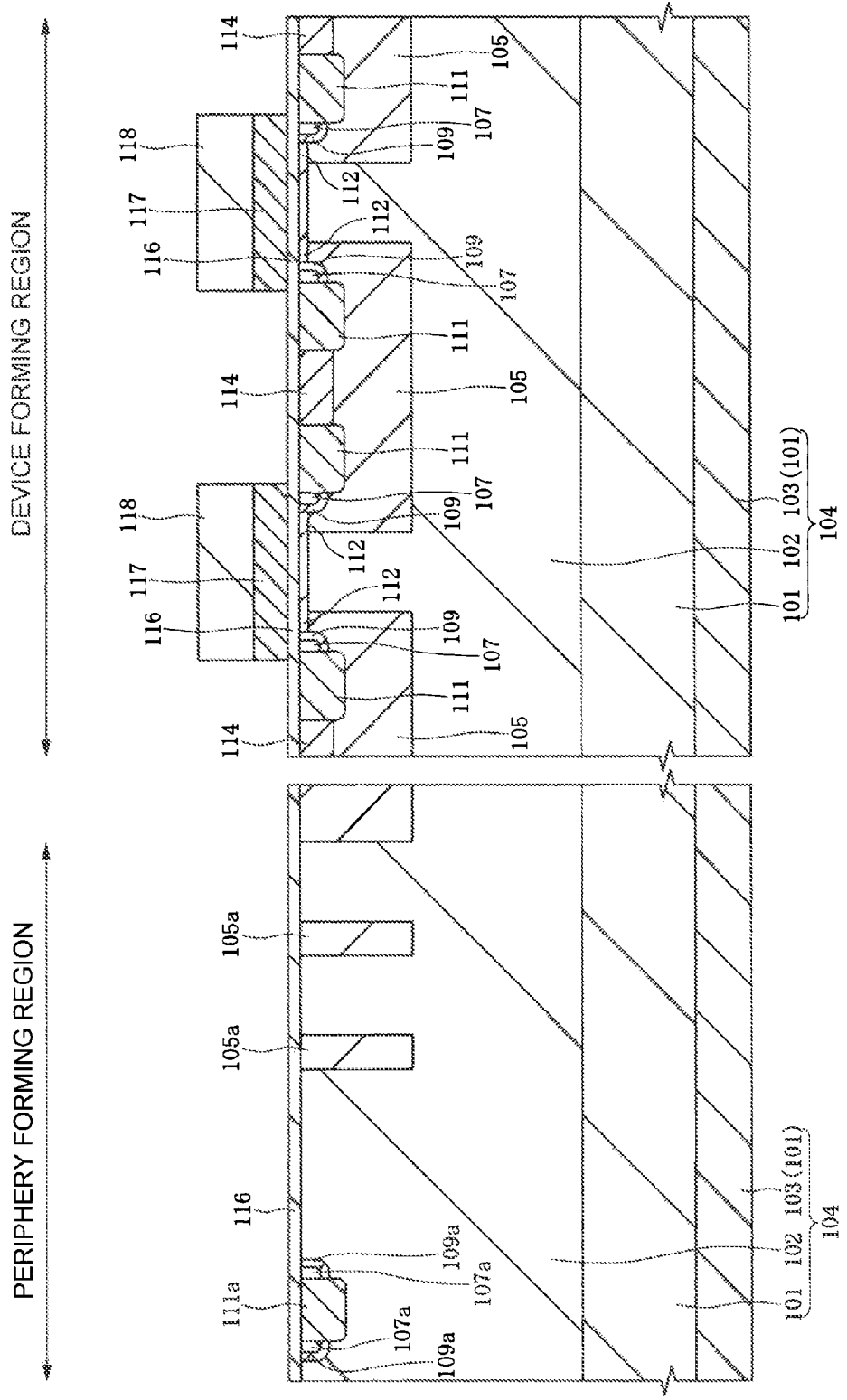
FIG. 12 is a cross-sectional view of a principal portion of the silicon carbide semiconductor device in the same place as in FIG. 3 in the process for producing the silicon carbide semiconductor device continued from FIG. 11.

Subsequently, as shown in FIG. 12, the polycrystalline silicon (Si) film 117A is processed using a mask 118 by a dry etching method, thereby forming a gate electrode 117.

Figure 13:
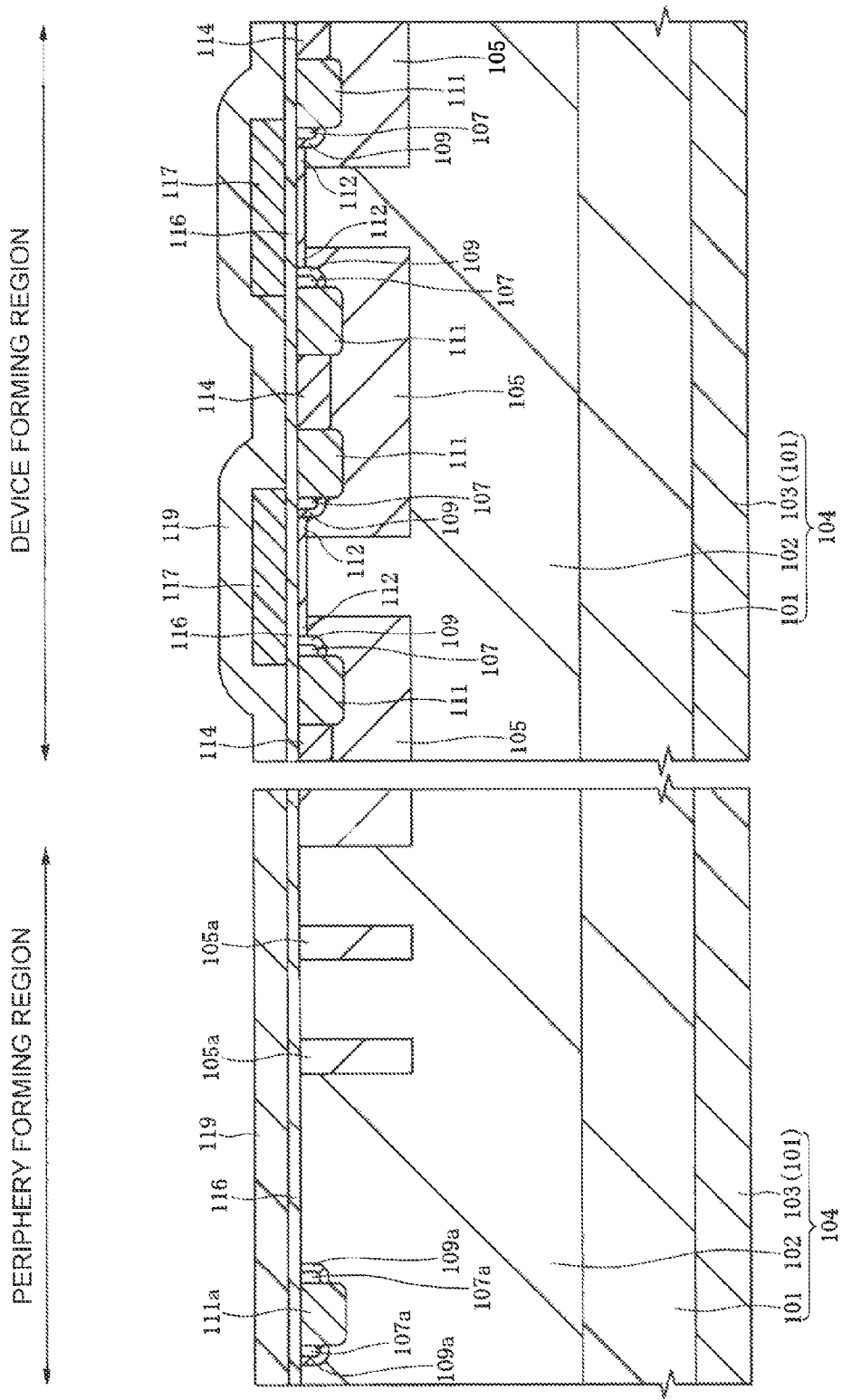
FIG. 13 is a cross-sectional view of a principal portion of the silicon carbide semiconductor device in the same place as in FIG. 3 in the process for producing the silicon carbide semiconductor device continued from FIG. 12.

Subsequently, as shown in FIG. 13, after the mask 118 is removed, on a surface of the n⁻-type epitaxial layer 102, an interlayer insulating film 119 is formed so as to cover the gate electrode 117 and the gate insulating film 116 by, for example, a plasma CVD method.

Figure 14:
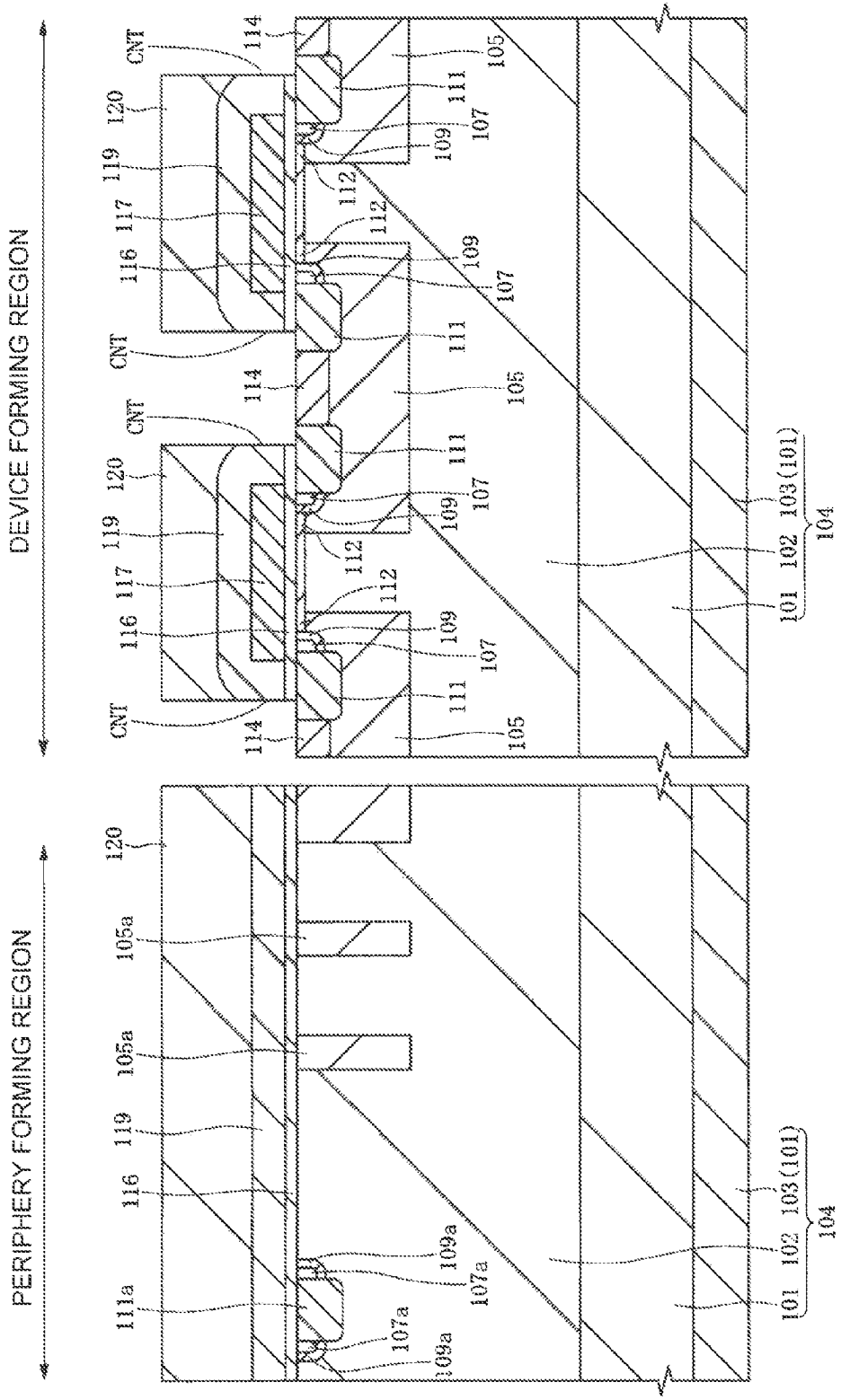
FIG. 14 is a cross-sectional view of a principal portion of the silicon carbide semiconductor device in the same place as in FIG. 3 in the process for producing the silicon carbide semiconductor device continued from FIG. 13.

Subsequently, as shown in FIG. 14, the interlayer insulating film 119 and the gate insulating film 116 are processed using a mask 120 by a dry etching method, thereby forming an opening CNT that reaches a part of the n⁺⁺-type source region 111 and the p⁺⁺-type potential fixing layer 114.

Figure 15:
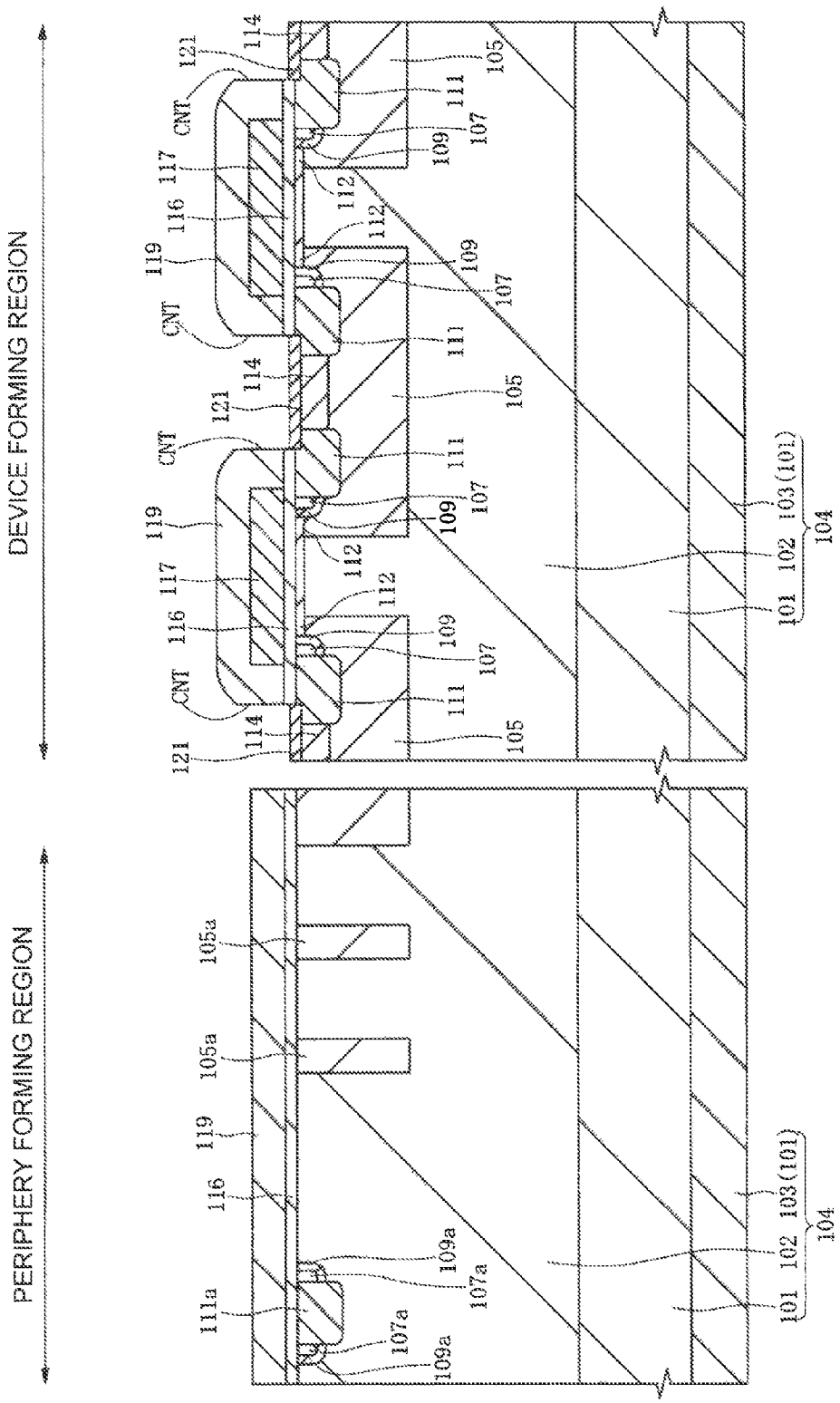
FIG. 15 is a cross-sectional view of a principal portion of the silicon carbide semiconductor device in the same place as in FIG. 3 in the process for producing the silicon carbide semiconductor device continued from FIG. 14.

Subsequently, as shown in FIG. 15, after the mask 120 is removed, a metal silicide layer 121 is formed on the respective surfaces of the part of the n⁺⁺-type source region 111 and the p⁺⁺-type potential fixing layer 114 exposed on a bottom surface of the opening CNT.

First, although not shown in the drawing, on the surface of the n⁻-type epitaxial layer 102, a first metal film, for example, nickel (Ni) is deposited so as to cover the interlayer insulating film 119 and an inner portion (a side surface and a bottom surface) of the opening CNT by, for example, a sputtering method. The thickness of this first metal film is, for example, about 0.05 μm. Subsequently, by performing a silicidation heat treatment at 500 to 900° C., the first metal film and the n⁻-type epitaxial layer 102 are reacted with each other in a region on the bottom surface of the opening CNT, thereby forming a metal silicide layer 121, for example, a nickel silicide (NiSi) layer on the respective surfaces of the part of the n⁺⁺-type source region 111 and the p⁺⁺-type potential fixing layer 114 exposed on the bottom surface of the opening CNT. Subsequently, the unreacted first metal film is removed by a wet etching method. In the wet etching method, for example, a mixture of sulfuric acid and hydrogen peroxide is used.

Subsequently, although not shown in the drawing, on the back surface of the n⁺-type SiC substrate 101, a second metal film is deposited by, for example, a sputtering method. The thickness of this second metal film is, for example, about 0.1 μm.

Figure 16:
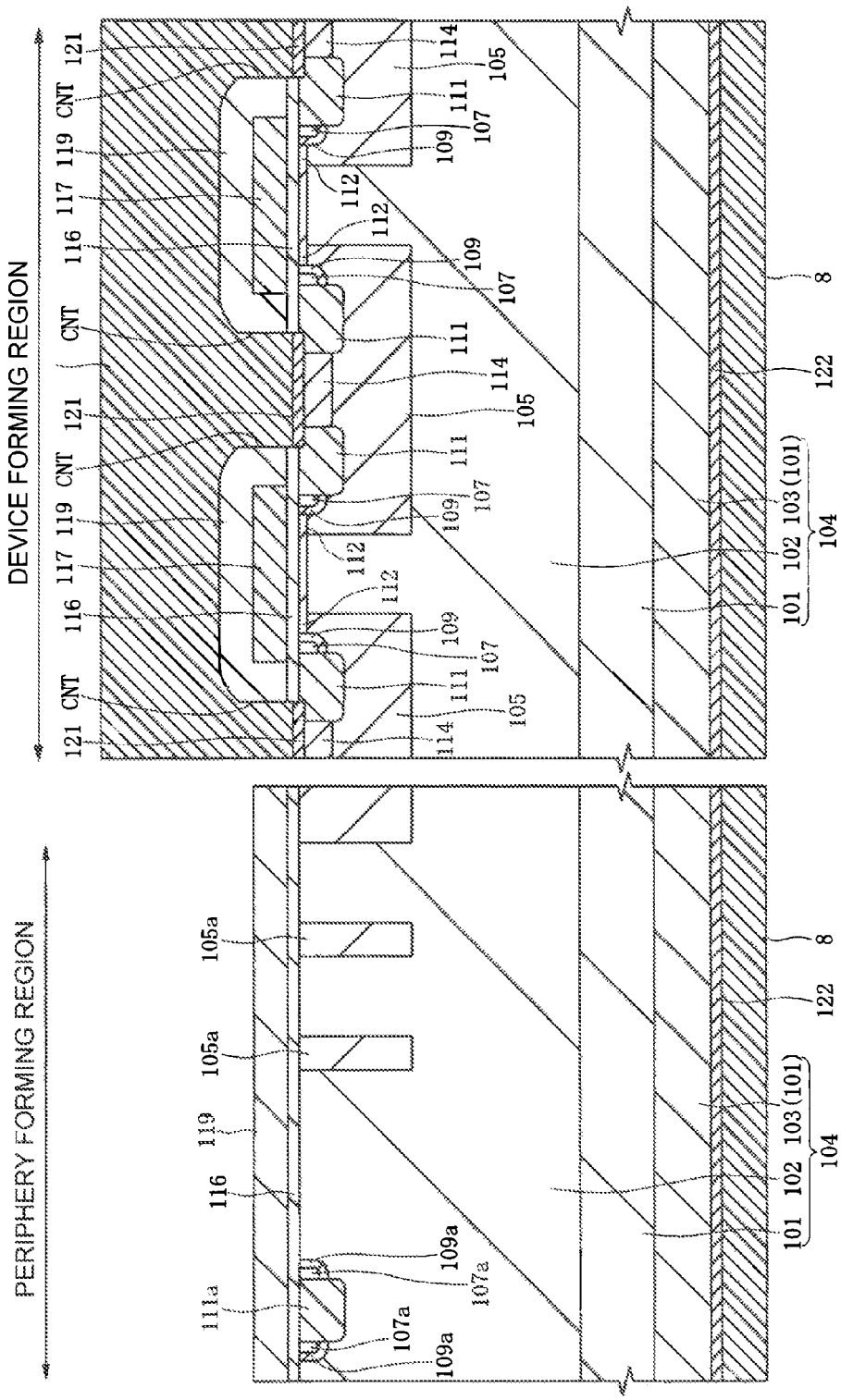
FIG. 16 is a cross-sectional view of a principal portion of the silicon carbide semiconductor device in the same place as in FIG. 3 in the process for producing the silicon carbide semiconductor device continued from FIG. 15.

Subsequently, as shown in FIG. 16, by performing a silicidation heat treatment at 800 to 1200° C., the second metal film and the n⁺-type SiC substrate 101 are reacted with each other, thereby forming a metal silicide layer 122 so as to cover the n⁺-type drain region 103 formed on the back surface side of the n⁺-type SiC substrate 101. Subsequently, a drain wiring electrode 8 is formed so as to cover the metal silicide layer 122. The thickness of the drain wiring electrode 8 is, for example, about 0.4 μm.

Subsequently, over a mask, the interlayer insulating film 119 is processed by a dry etching method, thereby forming an opening (not shown) that reaches the gate electrode 117.

Subsequently, a third metal film, for example, a laminate film composed of a titanium (Ti) film, a titanium nitride (TiN) film, and an aluminum (Al) film is deposited on the interlayer insulating film 119 including an inner portion of the opening CNT that reaches the metal silicide layer 121 formed on the respective surfaces of the part of the n⁺⁺-type source region 111 and the p⁺⁺-type potential fixing layer 114 and the opening (not shown) that reaches the gate electrode 117. The thickness of the third metal film is preferably, for example, 2.0 μm or more Subsequently, by processing the third metal film, a source wiring electrode 7 that is electrically connected to the part of the n⁺⁺-type source region 111 through the metal silicide layer 121, and a gate wiring electrode (not shown) that is electrically connected to the gate electrode 117 are formed. Thereafter, an external wiring is electrically connected to each of the source wiring electrode 7 and the gate wiring electrode (not shown).

Figure 17A:
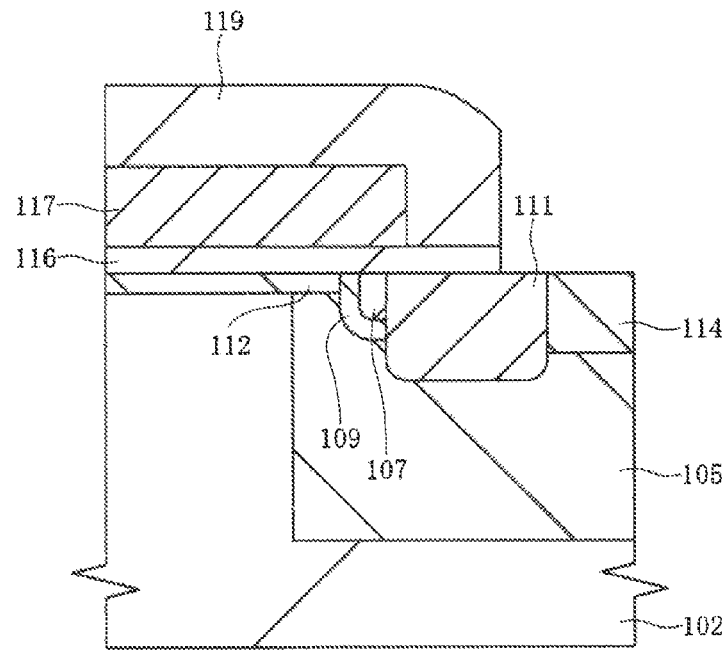
FIGS. 17A and 17B are cross-sectional views of a principal portion for explaining a modification example of the SiC power MISFET according to the first embodiment of the invention.

In the first embodiment, for example, as shown in FIG. 17A, the p⁺-type channel region 109 is formed such that the depth (fifth depth) of the p⁺-type channel region 109 from the surface of the epitaxial layer 102 is larger than the depth (second depth) of the n⁺-type source region 107 from the surface of the epitaxial layer 102 so that the p⁺-type channel region 109 surrounds a side surface and a bottom surface (lower surface) of the n⁺-type source region 107, however, it is not limited thereto.

Figure 17B:
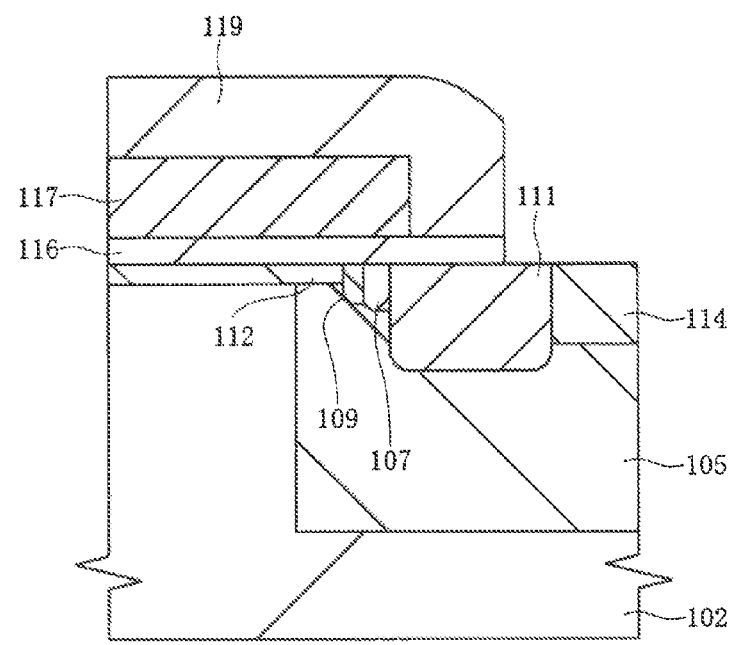

For example, as shown in FIG. 17B, the p⁺-type channel region 109 may be formed such that the depth (fifth depth) of the p⁺-type channel region 109 from the surface of the epitaxial layer 102 is smaller than the depth (second, depth) of the n⁺-type source region 107 from the surface of the epitaxial layer 102 so that the p⁺-type channel region 109 surrounds only a side surface of the n⁺-type source region 107.

In this manner, according to the first embodiment, since the channel region is constituted by the $n^-$-type, intrinsic, or $p^-$-type channel region 112 capable of realizing a high channel mobility and the $p^+$-type channel region 109 capable of realizing a high threshold voltage, both of a high channel mobility and a high threshold voltage can be realized in the SiC power MISFET.

Further, the source region is constituted by the $n^+$-type source region 107 and the $n^{++}$-type source region 111, the $n^+$-type source region 107 is formed between the $p^+$-type channel region 109 and the $n^{++}$-type source region 111, and the source wiring electrode 7 is electrically connected to the $n^{++}$-type source region 111 through the metal silicide layer 121. According to this configuration, an electric field in the $p^+$-type channel region 109 in contact with the $n^+$-type source region 107 is relaxed, and therefore, the deterioration of the gate insulating film 116 can be suppressed, and also the contact resistance between the $n^{++}$-type source region 111 and the source wiring electrode 7 can be decreased.

According to these, a SiC power MISFET having high performance and high reliability can be realized.

Second Embodiment

A different point between a second embodiment and the first embodiment described above is a method for forming a channel region. That is, in the first embodiment described above, the channel region is not formed by self-aligning, however, in the second embodiment, a channel region is formed by self-aligning.

Method for Producing Silicon Carbide Semiconductor Device

A method for producing a silicon carbide semiconductor device according to the second embodiment will be described in the order of steps with reference to FIGS. 18 to 25. FIGS. 18 to 25 are each an enlarged cross-sectional view of a principal portion showing a part of a SiC power MISFET forming region (a device forming region) and a part of a periphery forming region of a silicon carbide semiconductor device.

In the same manner as in the first embodiment described above, as shown in FIG. 18, on a front surface (first principal surface) of an $n^+$-type SiC substrate (substrate) 201, an $n^-$-type epitaxial layer 202 is formed, thereby forming a SiC epitaxial substrate 204 composed of the $n^+$-type SiC substrate 201 and the $n^-$-type epitaxial layer 202. The impurity concentration in the $n^+$-type SiC substrate 201 is, for example, in a range from $1 \times 10^{18}$ to $1 \times 10^{21}$ cm$^{-3}$, and the impurity concentration in the $n^-$-type epitaxial layer 202 is, for example, in a range from $1 \times 10^{14}$ to $1 \times 10^{17}$ cm$^{-3}$. Subsequently, an $n^+$-type drain region 203 is formed on a back surface (second principal surface) of the $n^+$-type SiC substrate 201. The impurity concentration in the $n^+$-type drain region 203 is, for example, in a range from $1 \times 10^{19}$ to $1 \times 10^{21}$ cm$^{-3}$.

Subsequently, on a surface of the $n^-$-type epitaxial layer 202, a hard mask (fourth mask) 206 composed of, for example, a silicon oxide ($SiO_2$) film (second insulating film) is formed. Subsequently, a p-type impurity, for example, an aluminum atom (Al) is ion-implanted into the $n^-$-type epitaxial layer 202 over the hard mask 206. By doing this, a p-type body layer (well region) 205 is formed in a device forming region on the front surface side of the $n^-$-type epitaxial layer 202 and a p-type ring 205a is formed in a periphery forming region. The depth (first depth) of the p-type body layer 205 and the p-type ring 205a from the surface of the epitaxial layer 202 is, for example, about 0.5 to 2.0 μm.

Further, the impurity concentration in the p-type body layer 205 and the p-type ring 205a is, for example, in a range from $1 \times 10^{16}$ to $1 \times 10^{19}$ cm$^{-3}$.

When the hard mask 206 is formed on the surface of the $n^-$-type epitaxial layer 202, a portion of the surface of the $n^-$-type epitaxial layer 202 (a portion from the surface to a depth of about 0.0 to 5.0 nm) is scraped off, and a first single stepped portion is formed in the $n^-$-type epitaxial layer 202 under a side surface of the hard mask 206.

Subsequently, an insulating film (third insulating film) 225 is deposited so as to cover the hard mask 206 and a part of the surface of the $n^-$-type epitaxial layer 202. The insulating film 225 is a silicon oxide ($SiO_2$) film deposited by, for example, a plasma CVD method. The thickness of the insulating film 225 is, for example, about 0.5 to 2.0 μm. At this time, in the periphery forming region, a gap between the adjacent masks 206 is buried by the insulating film 225.

Figure 19:
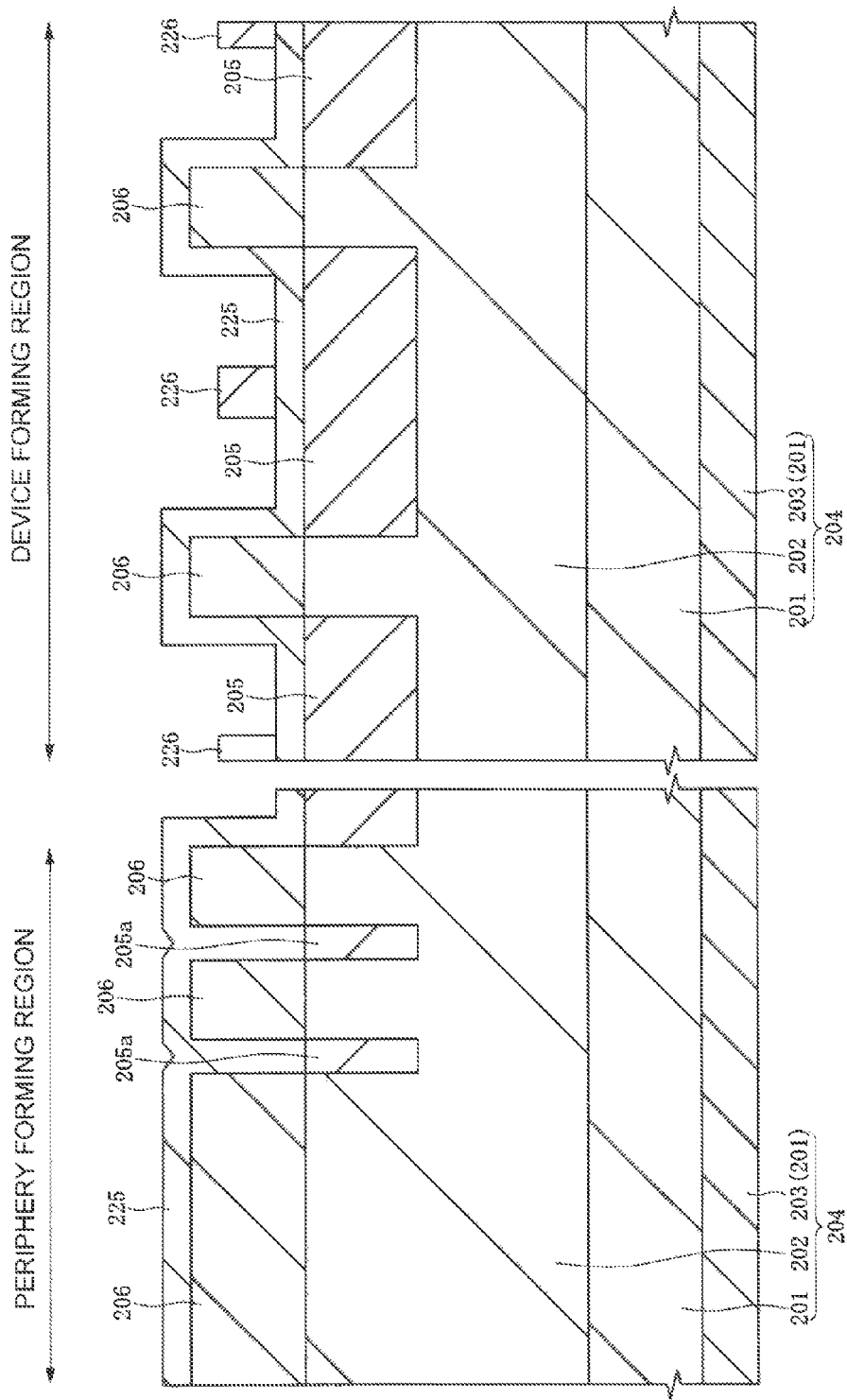
FIG. 19 is a cross-sectional view of a principal portion of the silicon carbide semiconductor device in the same place as in FIG. 18 in the process for producing the silicon carbide semiconductor device continued from FIG. 18.

Subsequently, as shown in FIG. 19, a mask 226 is formed so as to cover a region of apart of the device forming region where a source region is formed in a later step.

Figure 20:
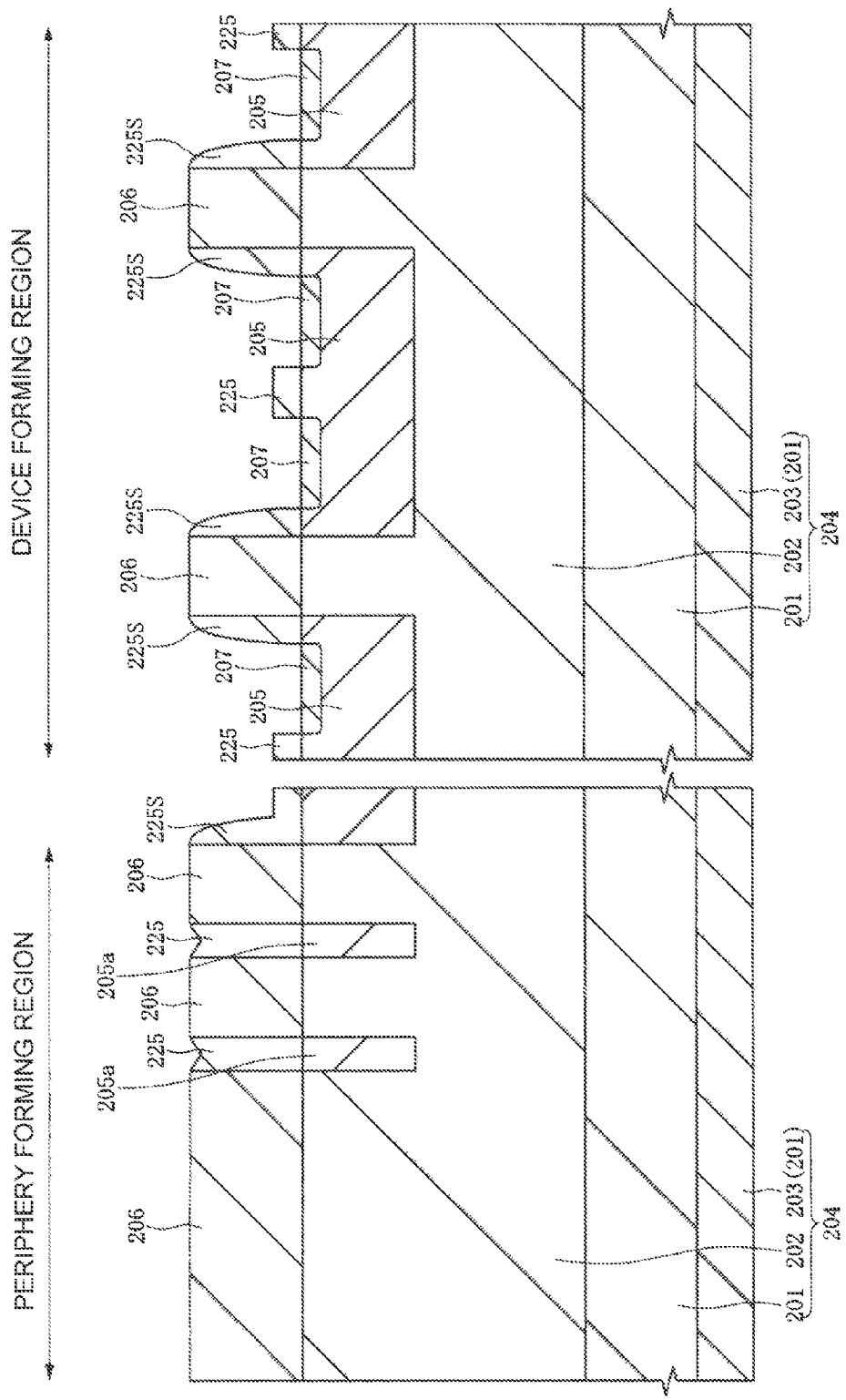
FIG. 20 is a cross-sectional view of a principal portion of the silicon carbide semiconductor device in the same place as in FIG. 18 in the process for producing the silicon carbide semiconductor device continued FIG. 19.
Figure 21:
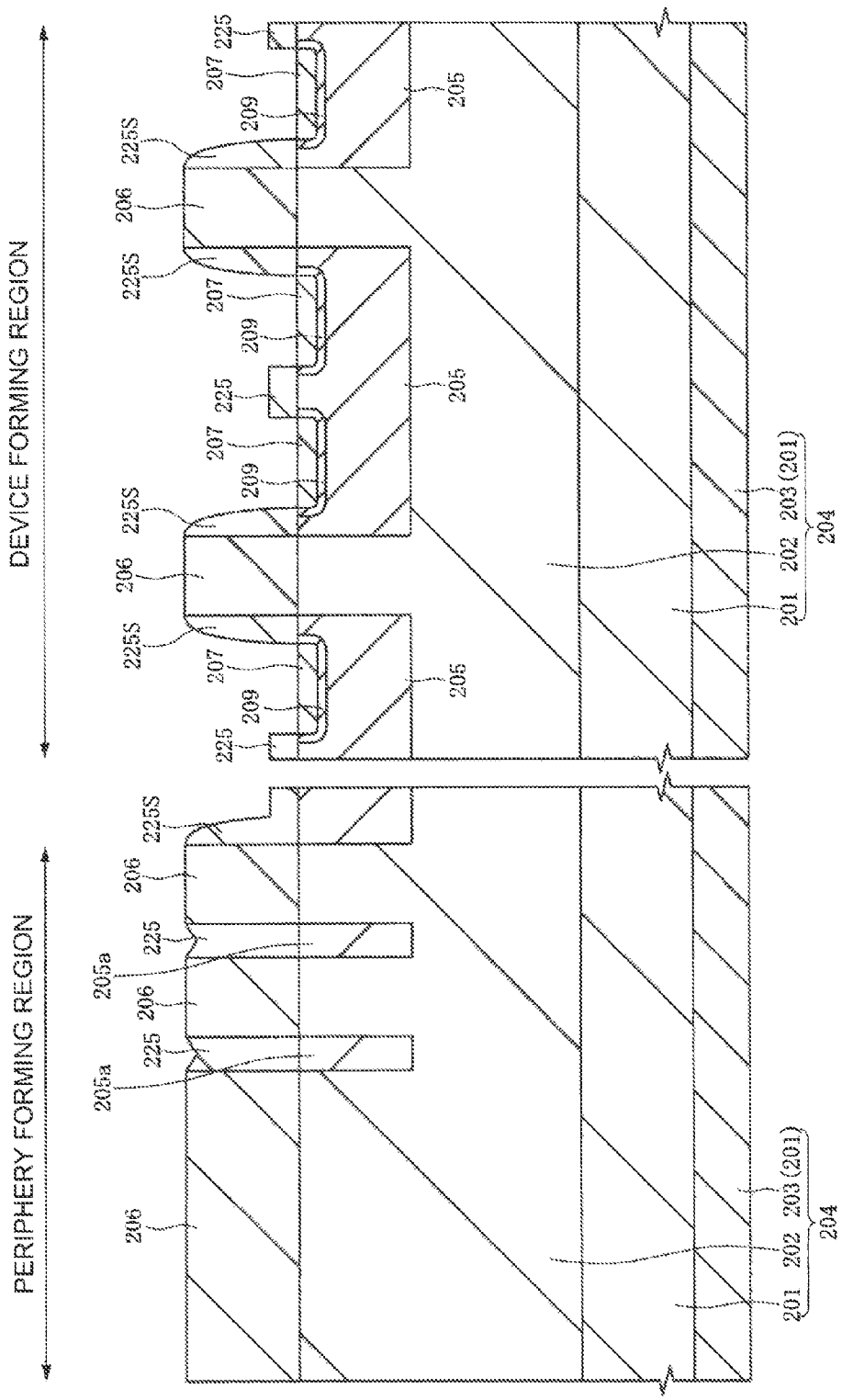
FIG. 21 is a cross-sectional view of a principal portion of the silicon carbide semiconductor device in the same place as in FIG. 18 in the process for producing the silicon carbide semiconductor device continued from FIG. 20.

Subsequently, as shown in FIG. 20, the insulating film 225 is processed by an anisotropic dry etching method using the mask 226, whereby the surface of the $n^-$-type epitaxial layer 202 in a region where the source region is formed in a later step is exposed while leaving a part of the insulating film 225 in the device forming region. At this time, a side wall (second side wall) 225S composed of the insulating film 225 is formed on a side surface of the hard mask 206. Here, a part of the p-type body layer 205 covered with the side wall 225S from an end portion of the p-type body layer 205 constitutes a whole channel region. In the periphery forming region, the gap between the adjacent hard masks 206 remains buried by the insulating film 225.

When the side wall 225S is formed on the surface of the $n^-$-type epitaxial layer 202, a portion of the surface of the $n^-$-type epitaxial layer 202 (a portion from the surface to a depth of about 0.0 to 5.0 nm) is scraped off, and a second single stepped portion is formed in the $n^-$-type epitaxial layer 202 under a side surface of the side wall 225S. A region sandwiched between the first single stepped portion and the second single stepped portion constitutes a channel region. Therefore, the channel length can be defined by the first single stepped portion and the second single stepped portion, and the sum of the length of an $n^-$-type, intrinsic, or $p^+$-type channel region 212 and the length of a $p^+$-type channel region 209, both of which are located in a region sandwiched between the first single stepped portion and the second single stepped portion and formed in a later step, corresponds to the channel length of the SiC power MISFET.

Subsequently, an n-type impurity, for example, a nitrogen atom (N) or a phosphorus atom (P) is ion-implanted into the $n^-$-type epitaxial layer 202 over a mask (first mask) composed of the hard mask 206, the side wall 2255, and the insulating film 225, thereby forming an $n^+$-type source region (second source region) 207. The depth (second depth) of the $n^+$-type source region 207 from the surface of the epitaxial layer 202 is, for example, about 0.1 to 0.2 μm.

An example in which a nitrogen atom (N) or a phosphorus atom (P) is used as the n-type impurity to be ion-implanted into the $n^-$-type epitaxial layer 202 is shown, however, any n-type impurity can be used as long as it is an n-type impurity, with which it is easy to form a shallow junction for decreasing the depth of the $n^+$-type source region 207 from the surface of the epitaxial layer 202. For example, a nitrogen molecule ($N_2$), nitrogen fluoride (NF), nitrogen difluoride ($N_2$), nitrogen trifluoride ($NF_3$), a phosphorus molecule ($P_2$), phosphine ($PH_3$), phosphorus fluoride (PF) phosphorus di fluoride (PF$_2$), phosphorus trifluoride (PF$_3$) or a mixed gas of any of the above gas species can be used. The impurity concentration in the n$^+$-type source region 207 is, for example, in a range from $1\times10^{17}$ to $1\times10^{21}$ cm$^{-3}$.

Subsequently, as sown in FIG. 21a p$^+$-type channel region (first channel region) 209 is formed so as to surround a side surface and a lower surface (bottom surface) of the n$^+$-type source region 207. For example, by obliquely ion-implanting a p-type impurity into the n$^-$-type epitaxial layer 202 over the hard mask 206, the side wall 225S, and the insulating film 225, the p$^+$-type channel region 209 is formed. As the p-type impurity, aluminum (Al) can be used. The implantation angle is desirably about 10 to 45 degrees with respect to the normal line of the n$^+$-type SiC substrate 201. The channel length of the p$^+$-type channel region 209 is, for example, about 0.01 to 0.2 μm. The impurity concentration in the p$^+$-type channel region 209 is, for example, in a range from $1\times10^{16}$ to $1\times10^{19}$ cm$^{-3}$.

Figure 22:
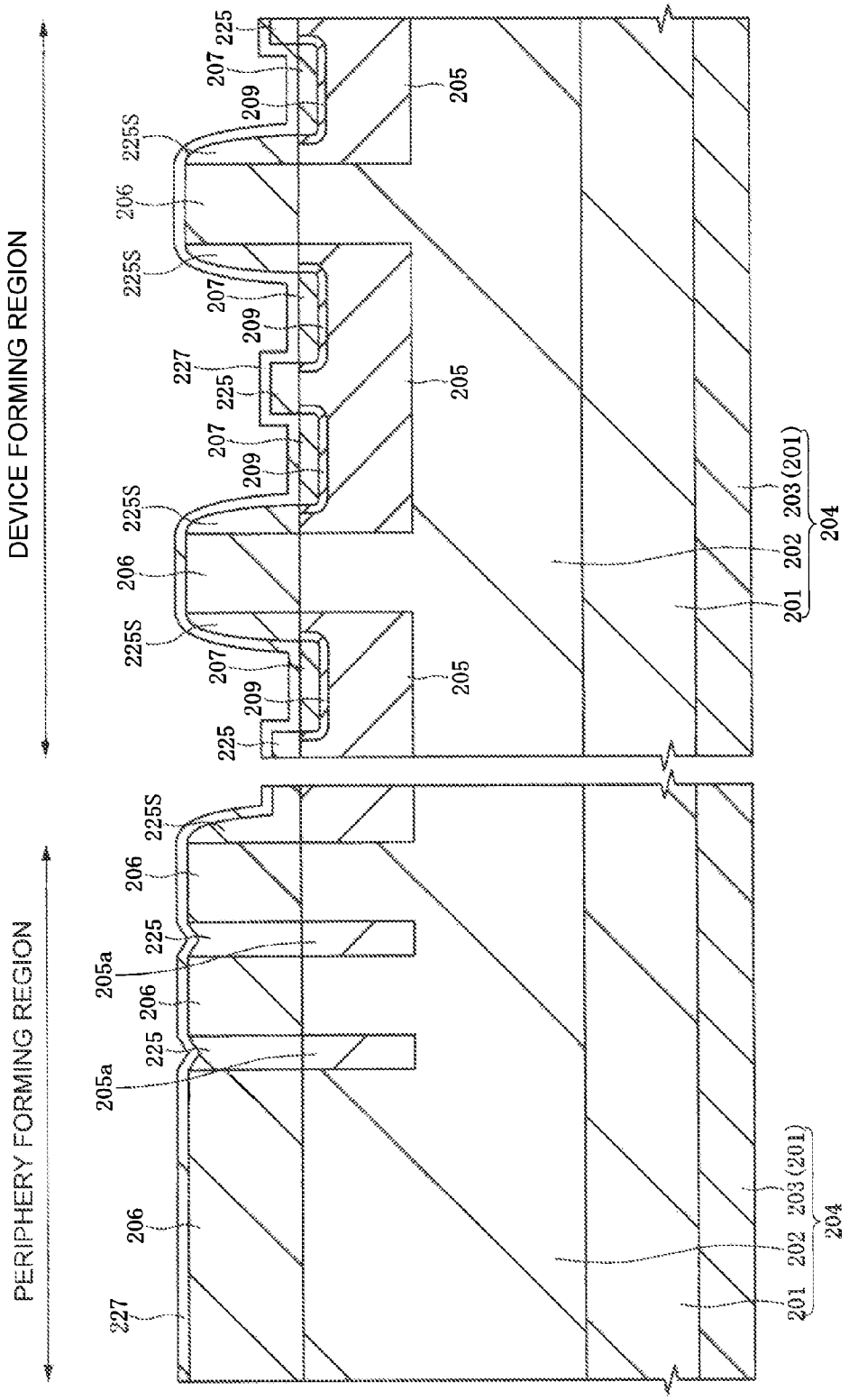
FIG. 22 is a cross-sectional view of a principal portion of the silicon carbide semiconductor device in the same place as in FIG. 18 in the process for producing the silicon carbide semiconductor device continued from FIG. 21.

Subsequently, as shown in FIG. 22, on a surface of the n$^+$-type epitaxial layer 202, an insulating film (first insulating film) 227, for example, a silicon oxide (SiO$_2$) film is deposited so as to cover the hard mask 206, the side wall 225S, and the insulating film 225 by, for example, a plasma CVD method. The thickness of the insulating film 227 is, for example, about 0.05 to 0.5 μm.

Figure 23:
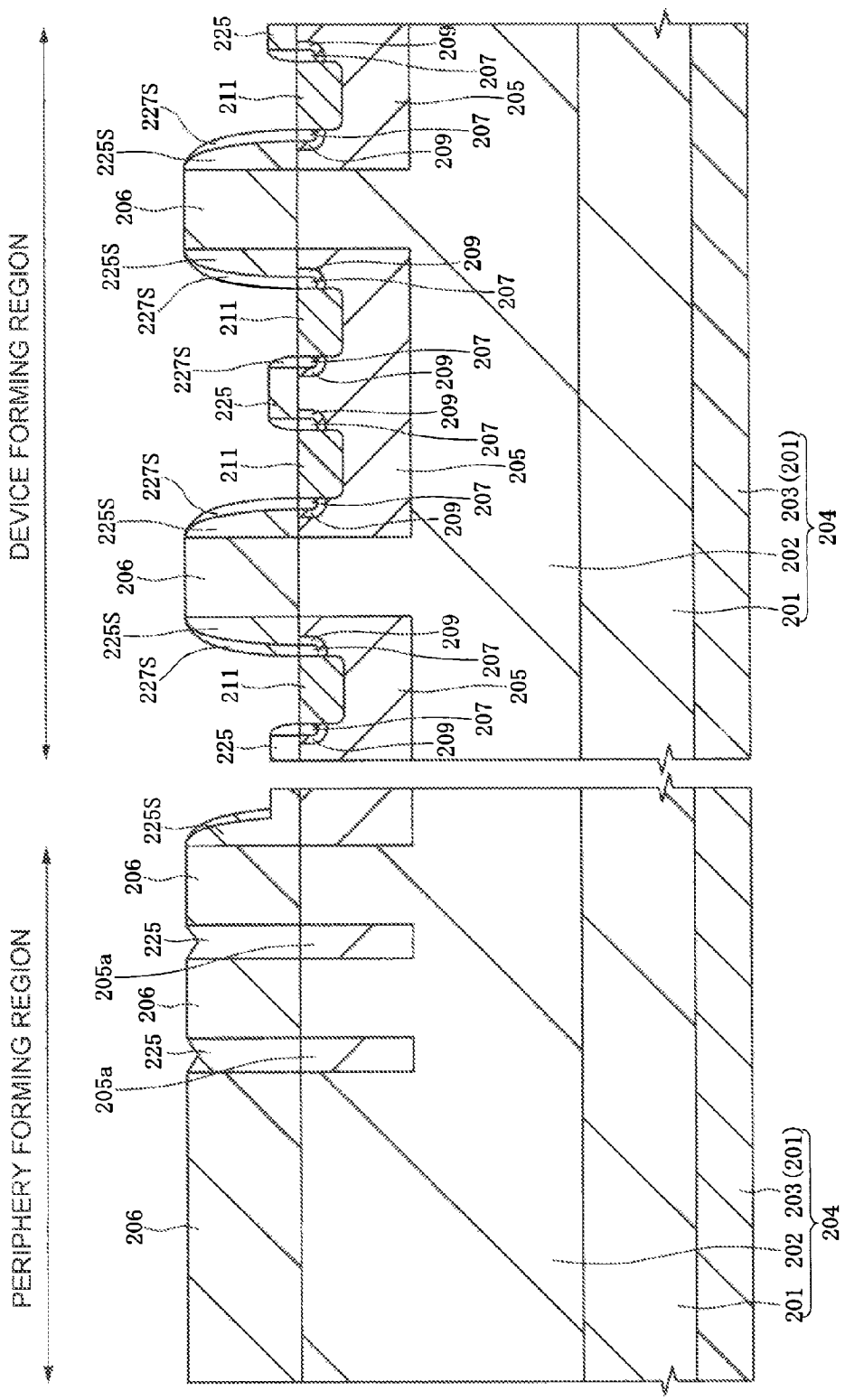
FIG. 23 is a cross-sectional view of a principal portion of the silicon carbide semiconductor device in the same place as in FIG. 18 in the process for producing the silicon carbide semiconductor device continued from FIG. 22.

Subsequently, as shown in FIG. 23, the insulating film 227 is processed by an anisotropic dry etching method, whereby a side wall (first side wall) 227S composed of the insulating film 227 is formed on a side surface of the side wall 225S, and a side surface of the insulating film 225.

Subsequently, an n-type impurity, for example, a nitrogen atom (N) or a phosphorus atom (P) is ion-implanted into the n$^-$-type epitaxial layer 202 over a mask (second mask) composed of the hard mask 206, the side wall 225S, the insulating film 225, and the side wall 227S, thereby forming an n$^{++}$-type source region (first source region) 211 in the device forming region. The depth (third depth) of the n$^{++}$-type source region 211 from the surface of the epitaxial layer 202 is, for example, about 0.1 to 0.4 μm. The impurity concentration in the n$^{++}$-type source region 211 is, for example, in a range from $1\times10^{18}$ to $1\times10^{21}$ cm$^{-3}$.

By undergoing the above steps, in the device forming region, a source region composed of the n$^+$-type source region 207 and the n$^{++}$-type source region 211 and a part of a channel region composed of the p$^+$-type channel region 209 are formed.

Figure 24:
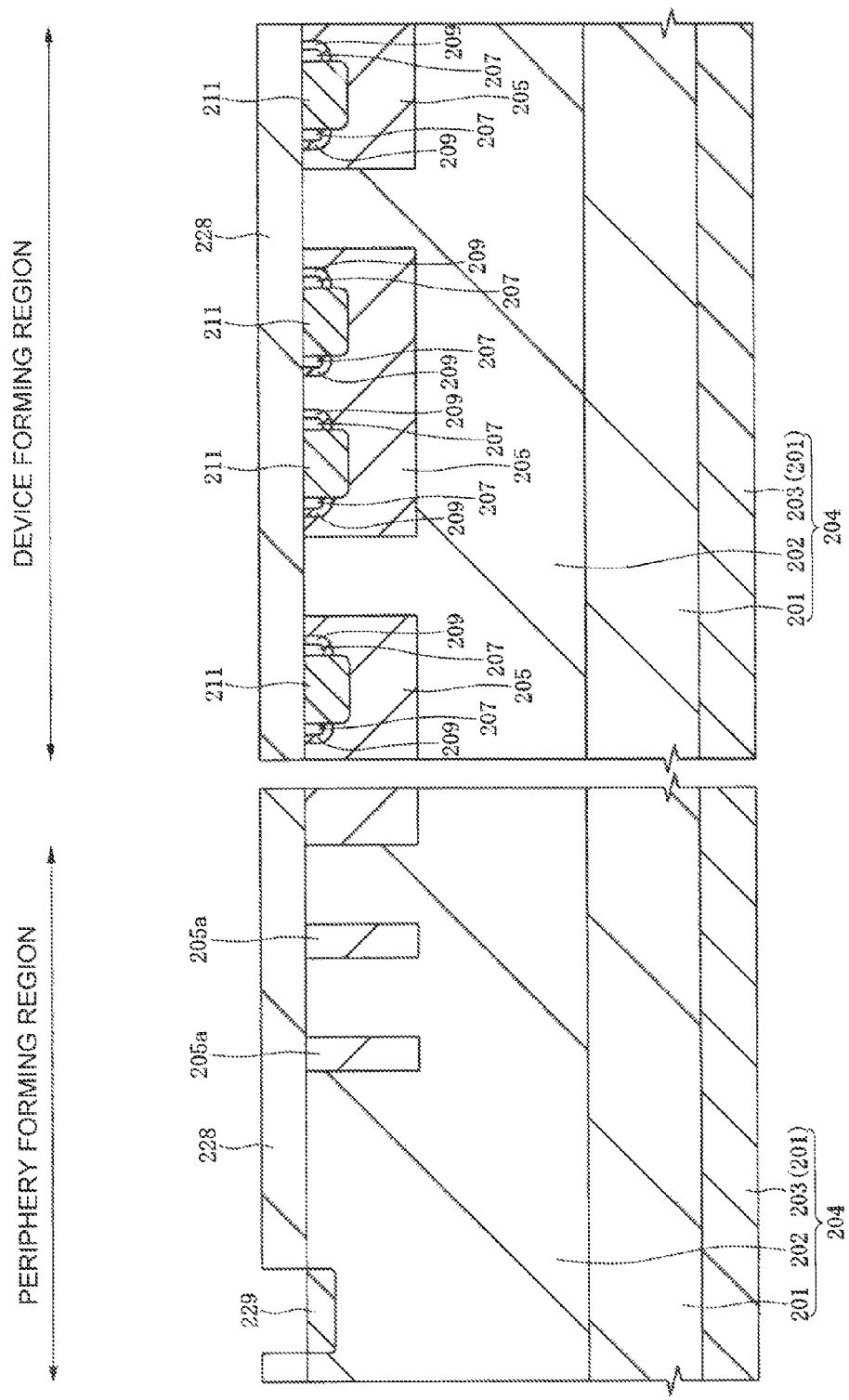
FIG. 24 is a cross-sectional view of a principal portion of the silicon carbide semiconductor device in the same place as in FIG. 18 in the process for producing the silicon carbide semiconductor device continued from FIG. 23.

Subsequently as shown in FIG. 24, after the hard mask 206, the side wall 225S, the insulating film 225, and the side wall 227S are removed, a mask (fifth mask) 228 is formed. The mask 228 is provided with an opening only in a region where an n$^{++}$-type guard ring 229 is formed in the periphery forming region in a later step.

Subsequently, an n-type impurity, for example, a nitrogen atom (N) or a phosphorus atom (P) is ion-implanted into the n$^-$-type epitaxial layer 202 over the mask 228, thereby forming an n$^{++}$-type guard ring 229 in the periphery forming region. The depth of the n$^{++}$-type guard ring 229 from the surface of the epitaxial layer 202 is, for example, about 0.1 to 0.4 μm. The impurity concentration in the n$^{++}$-type guard ring 229 is, for example, in a range from $1\times10^{18}$ to $1\times10^{21}$ cm$^{-3}$.

In the first embodiment described above, the source region (the n$^+$-type source region 107 and the n$^{++}$-type source region 111) and the guard ring (the n$^+$-type guard ring 107a and the n$^{++}$-type guard ring 111a) are formed simultaneously, and therefore, the impurity distributions in both regions are the same as each other. However, in the second embodiment, the source region (the n$^+$-type source region 207 and the n$^{++}$-type source region 211) and the guard ring (the n$^{++}$-type guard ring 229) are formed in the different steps, and therefore, the impurity distributions in both regions are different from each other.

Figure 25:
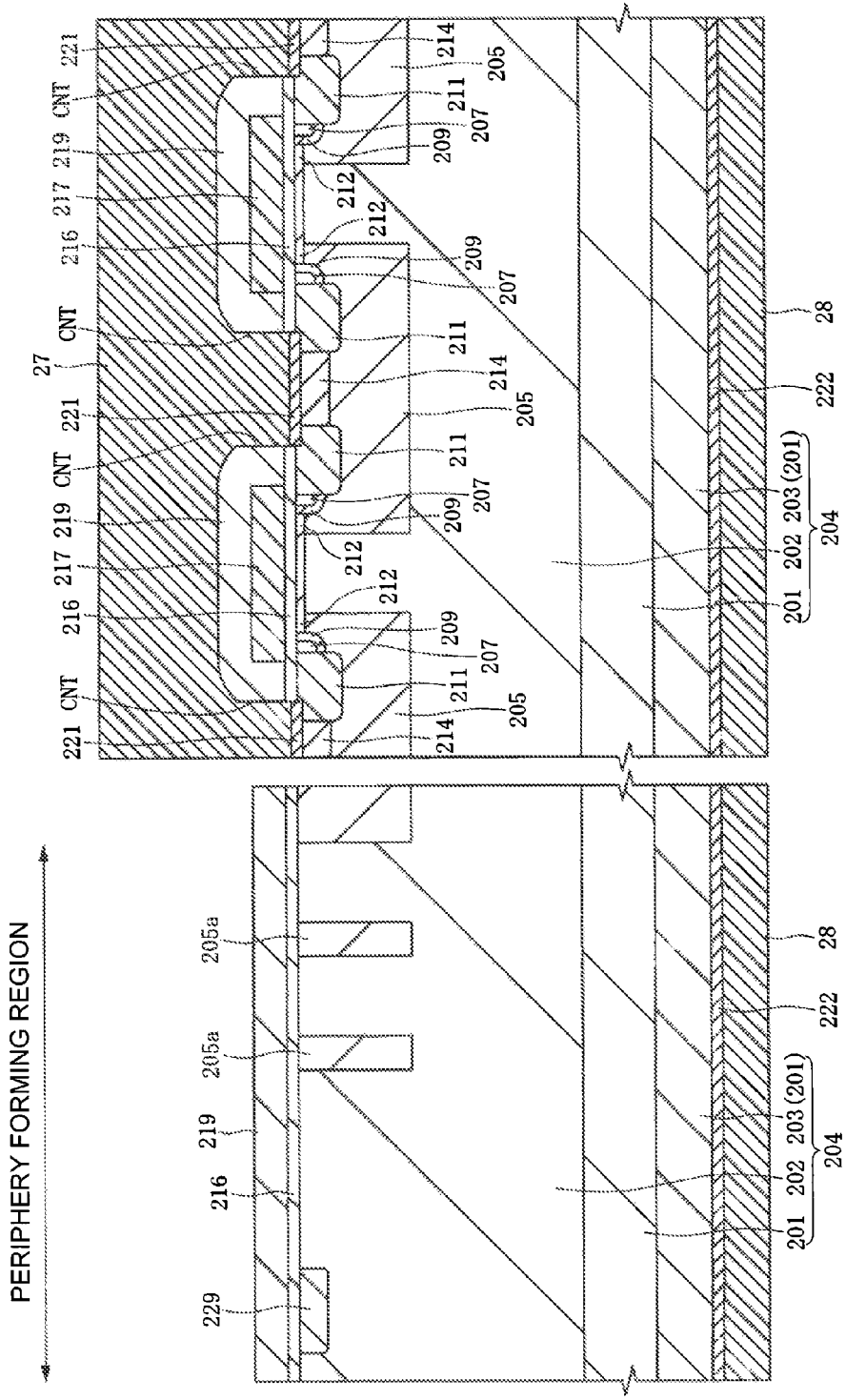
FIG. 25 is a cross-sectional view of a principal portion of the silicon carbide semiconductor device in the same place as in FIG. 18 in the process for producing the silicon carbide semiconductor device continued from FIG. 24.

Thereafter, as shown in FIG. 25, in the same manner as in the first embodiment described above, an n$^-$-type, intrinsic, or p$^-$-type channel region 212 (second channel region), a p$^{++}$-type potential fixing layer 214 that fixes a potential of the p-type body layer 205, a gate insulating film 216, a gate electrode 217, etc. are formed in the device forming region. Subsequently, on a surface of the n$^-$-type epitaxial layer 202, an interlayer insulating film 219 is formed, and thereafter, an opening CNT is formed in a desired region in the interlayer insulating film 219, and then, a metal silicide layer 221 is formed on the respective surfaces of the part of the n$^{++}$-type source region 211 and the p$^{++}$-type potential fixing layer 214 exposed on a bottom surface of the opening CNT.

Subsequently, a metal silicide layer 222 is formed so as to cover the n$^+$-type drain region 203 formed on the back surface side of the n$^+$-type SiC substrate 201, and then, a drain wiring electrode 28 is formed so as to cover the metal silicide layer 222.

Subsequently, an opening (not shown) that reaches the gate electrode 217 is formed in the interlayer insulating film 219, and then, a source wiring electrode 27 that is electrically connected to a part of the n$^{++}$-type source region 211 through the metal silicide layer 221, and a gate wiring electrode (not shown) that is electrically connected to the gate electrode 217 are formed.

In this manner, according to the second embodiment, since the channel region is constituted by the n$^-$-type, intrinsic, or p$^-$-type channel region 212 capable of realizing a high channel mobility and the p$^+$-type channel region 209 capable of realizing a high threshold voltage, both of a high channel mobility and a high threshold voltage can be realized in the SiC power MISFET.

Further, the source region is constituted by the n$^+$-type source region 207 and the n$^{++}$-type source region 211, the n$^+$-type source region 207 is formed between the p$^+$-type channel region 209 and the n$^{++}$-type source region 211, and the source wiring electrode 27 is connected to the n$^{++}$-type source region 211 through the metal silicide layer 221. According to this configuration, an electric field in the p$^+$-type channel region 209 in contact with the n$^+$-type source region 207 is relaxed, and therefore, the deterioration of the gate insulating film 216 can be suppressed, and also the contact resistance between the n$^{++}$-type source region 211 and the source wiring electrode 27 can be decreased.

Further, a region sandwiched between the first single stepped portion formed in the n$^-$-type epitaxial layer 202 in the step of forming the p-type body layer 205 and the second single stepped portion formed in the n$^-$-type epitaxial layer 202 in the step of forming the n$^{++}$-type source region 211 constitutes the channel region. Therefore, the channel length can be defined by the first single stepped portion and the second single stepped portion, and the sum of the length of the n$^-$-type, intrinsic, or p$^-$-type channel region 212 and the length of the p$^+$-type channel region 209, which are located in the region sandwiched between the first single stepped portion and the second single stepped portion, corresponds to the channel length of the SiC power MISFET.

Further, since this channel region is formed by self-aligning, it is easy to form a short channel. Therefore, it is easy to reduce the channel resistance. A decrease in threshold voltage due to a decrease in channel length can be suppressed by controlling the impurity concentration in the p$^+$-type channel region 209, etc.

Further, in the SiC power MISFET having a DMOS structure, since the channel region is formed by self-aligning, the channel lengths on both sides of the JFET region are not different from each other. Therefore, a shift of the threshold voltage is not caused.

According to these, a SiC power MISFET having high performance and high reliability can be realized.

Third Embodiment

A different point of a third embodiment from the first and second embodiments described above is that a trench structure is adopted. That is, in the first embodiment described above, the gate insulating film 116 is provided on a surface of the SiC epitaxial substrate 104, however, in the third embodiment, a gate insulating film is provided on aside surface and a bottom surface of a trench provided perpendicularly to a SiC epitaxial substrate.

Method for Producing Silicon Carbide Semiconductor Device

Next, a method for producing a silicon carbide semiconductor device according to the third embodiment will be described in the order of steps with reference to FIGS. 26 to 31. FIGS. 26 to 31 are each an enlarged cross-sectional view of a principal portion showing a part of a SiC power MISFET forming region (a device forming region) and a part of a periphery forming region of a silicon carbide semiconductor device.

Figure 26:
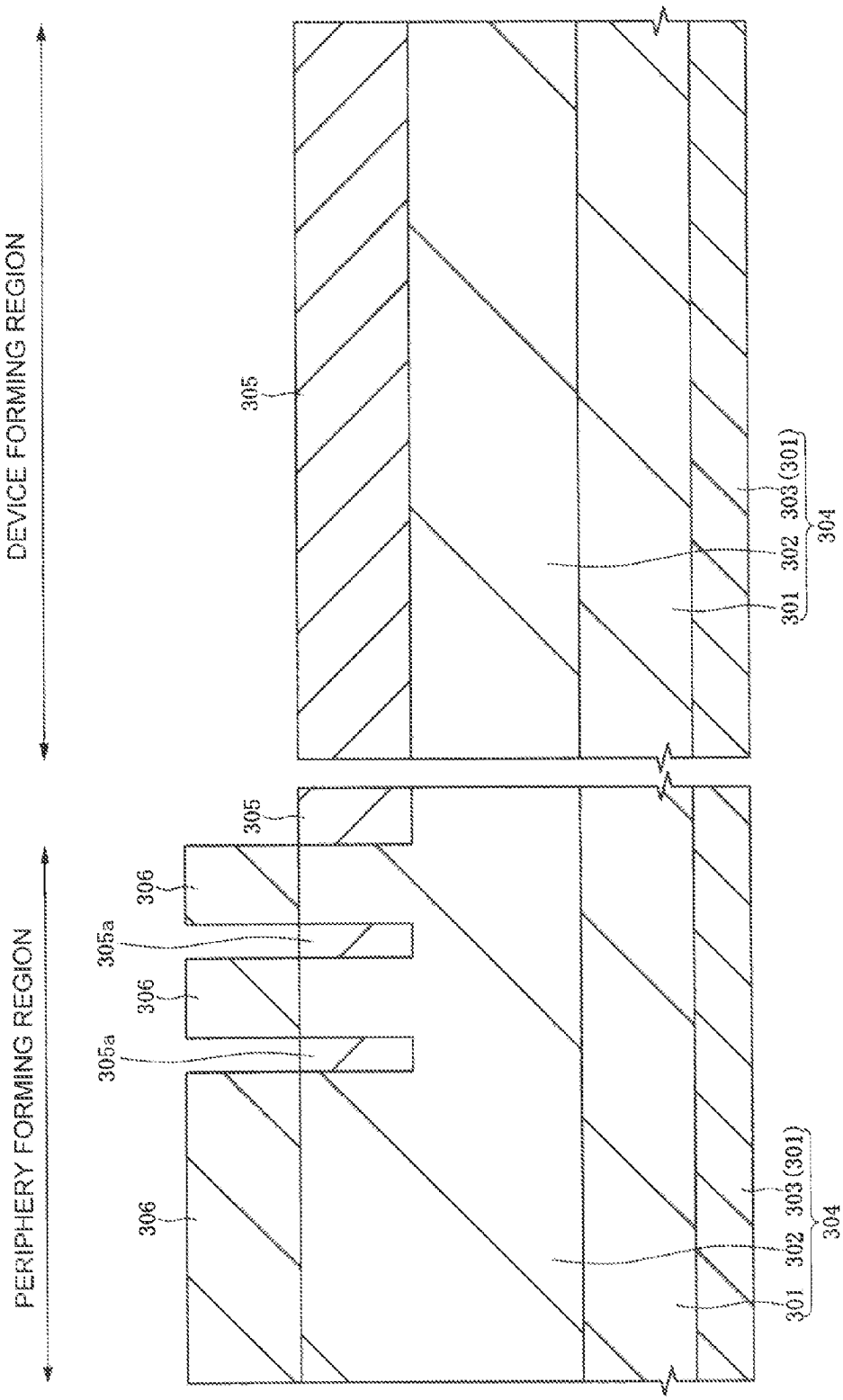
FIG. 26 is a cross-sectional view of a principal portion of a silicon carbide semiconductor device for explaining a process for producing a silicon carbide semiconductor device according to a third embodiment of the invention.

First, as shown in FIG. 26, in the same manner as in the first embodiment described above, on a front surface (first principal surface) of an n$^+$-type SIC substrate (substrate) 301, an n$^-$-type epitaxial layer 302 is formed, thereby forming a SiC epitaxial substrate 304 composed of the n$^+$-type SiC substrate 301 and the n$^-$-type epitaxial layer 302. The impurity concentration in the n$^+$-type SiC substrate 301 is, for example, in a range from $1\times10^{18}$ to $1\times10^{21}$ cm$^{-3}$, and the impurity concentration in the n$^-$-type epitaxial layer 302 is, for example, in a range from $1\times10^{14}$ to $1\times10^{17}$ cm$^{-3}$. Subsequently, an n$^+$-type drain region 303 having a predetermined depth (sixth depth) from the surface of the n$^+$-type SiC substrate 301 is formed on a back surface (second principal surface) of the n$^+$-type SiC substrate 301. The impurity concentration in the n$^+$-type drain region 303 is, for example, in a range from $1\times10^{19}$ to $1\times10^{21}$ cm$^{-3}$.

Subsequently, on a surface of the n$^-$-type epitaxial layer 302, a hard mask 306 composed of, for example, a silicon oxide (SiO$_2$) film is formed. Subsequently, a p-type impurity, for example, an aluminum atom (Al) is ion-implanted into the n$^-$-type epitaxial layer 302 over the hard mask 306. By doing this, a p-type body layer 305 is formed in a device forming region on the front surface side of the n$^-$-type epitaxial layer 302, and a p-type ring 305a is formed in a periphery forming region. The depth (first depth) of the p-type body layer 305 and the p-type ring 305a from the surface of the epitaxial layer 302 is, for example, about 0.5 to 2.0 μm. Further, the impurity concentration in the p-type body layer 305 and the p-type ring 305a is, for example, in a range from $1\times10^{16}$ to $1\times10^{19}$ cm$^{-3}$.

Figure 27:
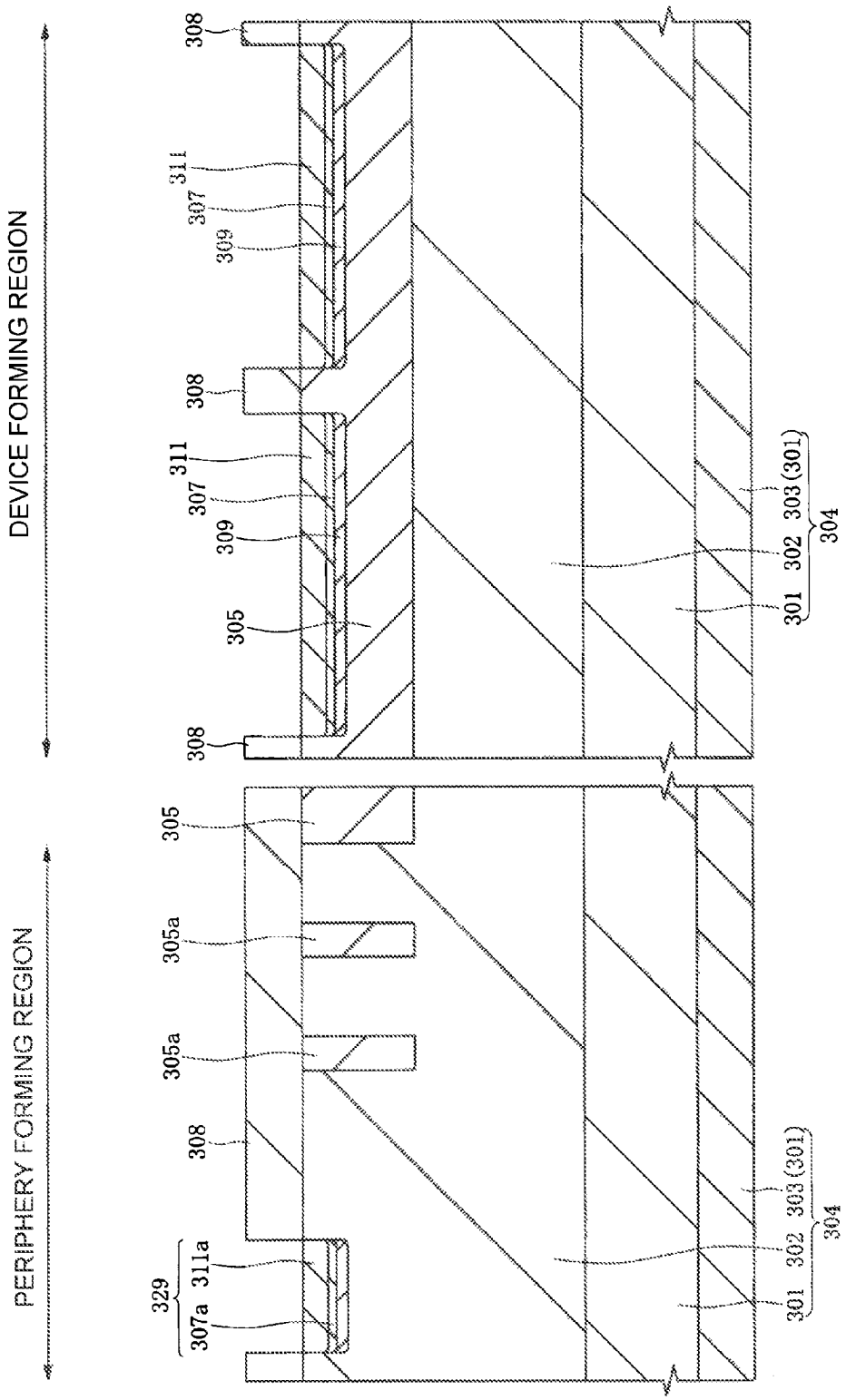
FIG. 27 is a cross-sectional view of a principal portion of the silicon carbide semiconductor device in the same place as in FIG. 26 in the process for producing the silicon carbide semiconductor device continued from FIG. 26.

Subsequently, as shown in FIG. 27, after the hard mask 306 is removed, a hard mask (sixth mask) 308 composed of, for example, a silicon oxide (SiO$_2$) film is formed on a surface of the n$^-$-type epitaxial layer 302. Subsequently, a p-type impurity, for example, an aluminum atom (Al) is ion-implanted into the n$^-$-type epitaxial layer 302 over the hard mask 308, thereby forming a p$^+$-type channel region (first channel region) 309 in the device forming region. The depth (fifth depth) of the p$^+$-type channel region 309 from the surface of the epitaxial layer 302 is, for example, about 0.4 to 0.6 μm. Further, the impurity concentration in the p$^+$-type channel region 309 is, for example, in a range from $1\times10^{16}$ to $1\times10^{19}$ cm$^{-3}$.

Subsequently, an n-type impurity, for example, a nitrogen atom (N) or a phosphorus atom (P) is ion-implanted into the n$^-$-type epitaxial layer 302 over the hard mask 308, whereby an n$^+$-type source region (second source region) 307 is formed in the p$^+$-type channel region 309. The depth (second depth) of the n$^+$-type source region 307 from the surface of the epitaxial layer 302 is, for example, about 0.3 to 0.4 μm. Further, the impurity concentration in the n$^+$-type source region 307 is, for example, in a range from $1\times10^{17}$ to $1\times10^{21}$ cm$^{-3}$.

Subsequently, an n-type impurity, for example, nitrogen atom (N) or a phosphorus atom (P) is ion-implanted into the n$^-$-type epitaxial layer 302 over the hard mask 308, whereby an n$^{++}$-type source region (first source region) 311 is formed in the n$^+$-type source region 307. The depth (third depth) of the n$^{++}$-type source region 311 from the surface of the epitaxial layer 302 is, for example, about 0.2 to 0.3 μm. Further, the impurity concentration in the n$^{++}$-type source region 311 is, for example, in a range from $1\times10^{18}$ to $1\times10^{21}$ cm$^{-3}$.

When the p$^+$-type channel region 309, the n$^+$-type source region 307, and the n$^{++}$-type source region 311 are formed in the device forming region, an n$^+$-type guard ring 329 is formed simultaneously in the periphery forming region. Accordingly, in the third embodiment, the source region (the n$^+$-type source region 307 and the n$^{++}$-type source region 311) and the guard ring (an n$^+$-type guard ring 307a and an n$^{++}$-type guard ring 311a) are formed simultaneously, and therefore, the impurity distributions in the depth direction in both regions are the same as each other.

Figure 28:
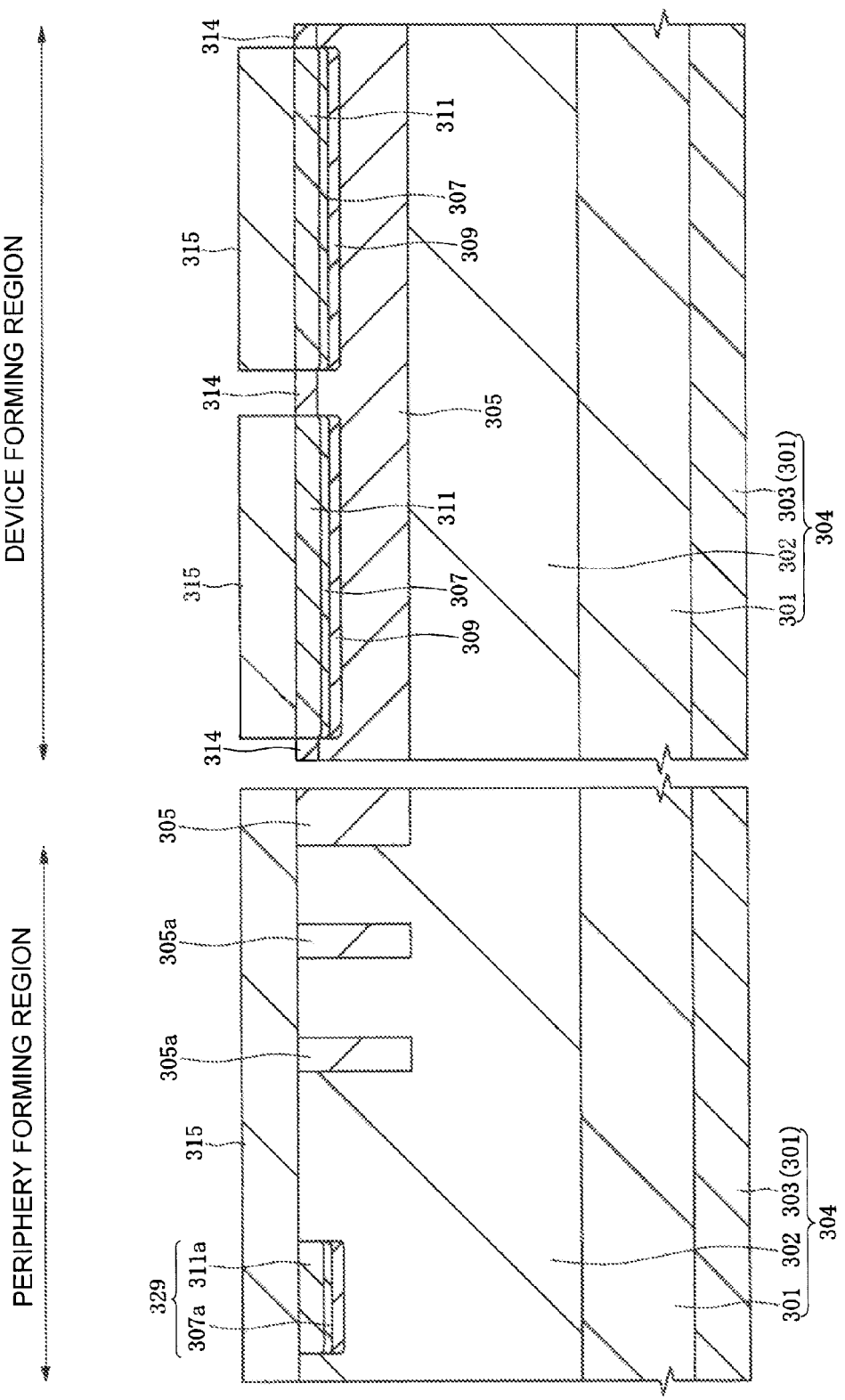
FIG. 28 is a cross-sectional view of a principal portion of the silicon carbide semiconductor device in the same place as in FIG. 26 in the process for producing the silicon carbide semiconductor device continued from FIG. 27.

Subsequently, as shown in FIG. 28, after the hard mask 308 is removed, a mask 315 is formed. The mask 315 is provided with an opening only in a region where a p$^{++}$-type potential fixing layer 314 that fixes a potential of the p-type body layer 305 is formed in a later step. The thickness of the mask 315 is, for example, about 0.2 to 1.0 μm.

Subsequently, a p-type impurity, for example, an aluminum atom (Al) is ion-implanted into the n$^-$-type epitaxial layer 302 over the mask 315, thereby forming the p$^{++}$-type potential fixing layer 314. The depth (seventh depth) of the p$^{++}$-type potential fixing layer 314 from the surface of the epitaxial layer 302 is, for example, about 0.1 to 0.4 μm. The impurity concentration in the p$^{++}$-type potential fixing layer 314 is, for example, in a range from $1\times10^{19}$ to $1\times10^{21}$ cm$^{-3}$.

Figure 29:
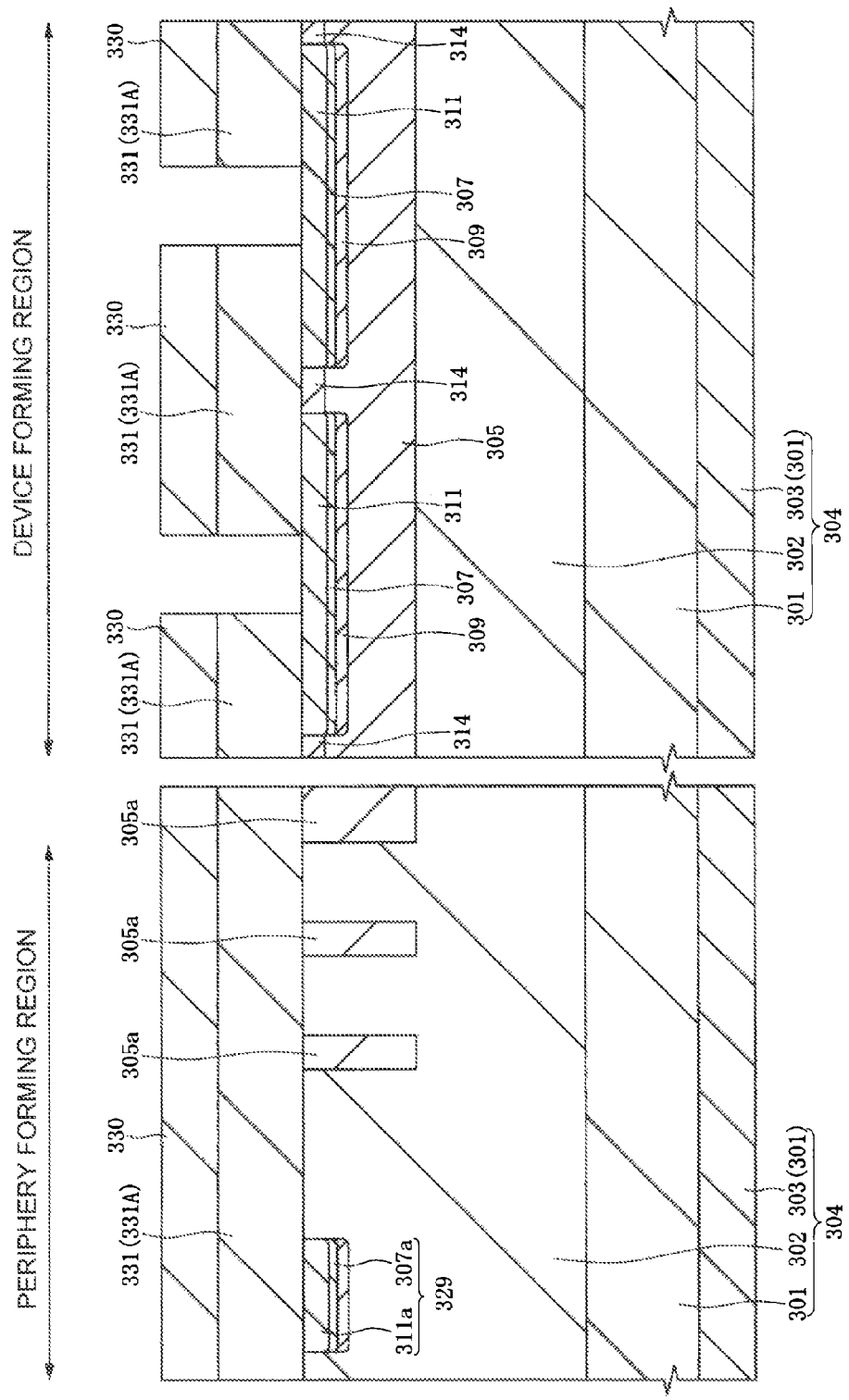
FIG. 29 is a cross-sectional view of a principal portion of the silicon carbide semiconductor device in the same place as in FIG. 26 in the process for producing the silicon carbide semiconductor device continued from FIG. 28.

Subsequently, as shown in FIG. 29, after the mask 315 is removed, a hard mask (seventh mask) 331 for forming a trench in the SiC epitaxial substrate 304 in a later step is formed. The hard mask 331 can be formed, for example, as follows. First, an insulating film 331A is deposited on a surface of the n$^-$-type epitaxial layer 302. The insulating film 331A is composed of a silicon oxide (SiO$_2$) film formed by, for example, a plasma CVD method. Subsequently, a mask 330 in which a resist film is patterned on the insulating film 331A is formed, and thereafter, the insulating film 331A is processed by a dry etching method using the mask 330, whereby the hard mask 331 composed of the insulating film 331A is formed.

Figure 30:
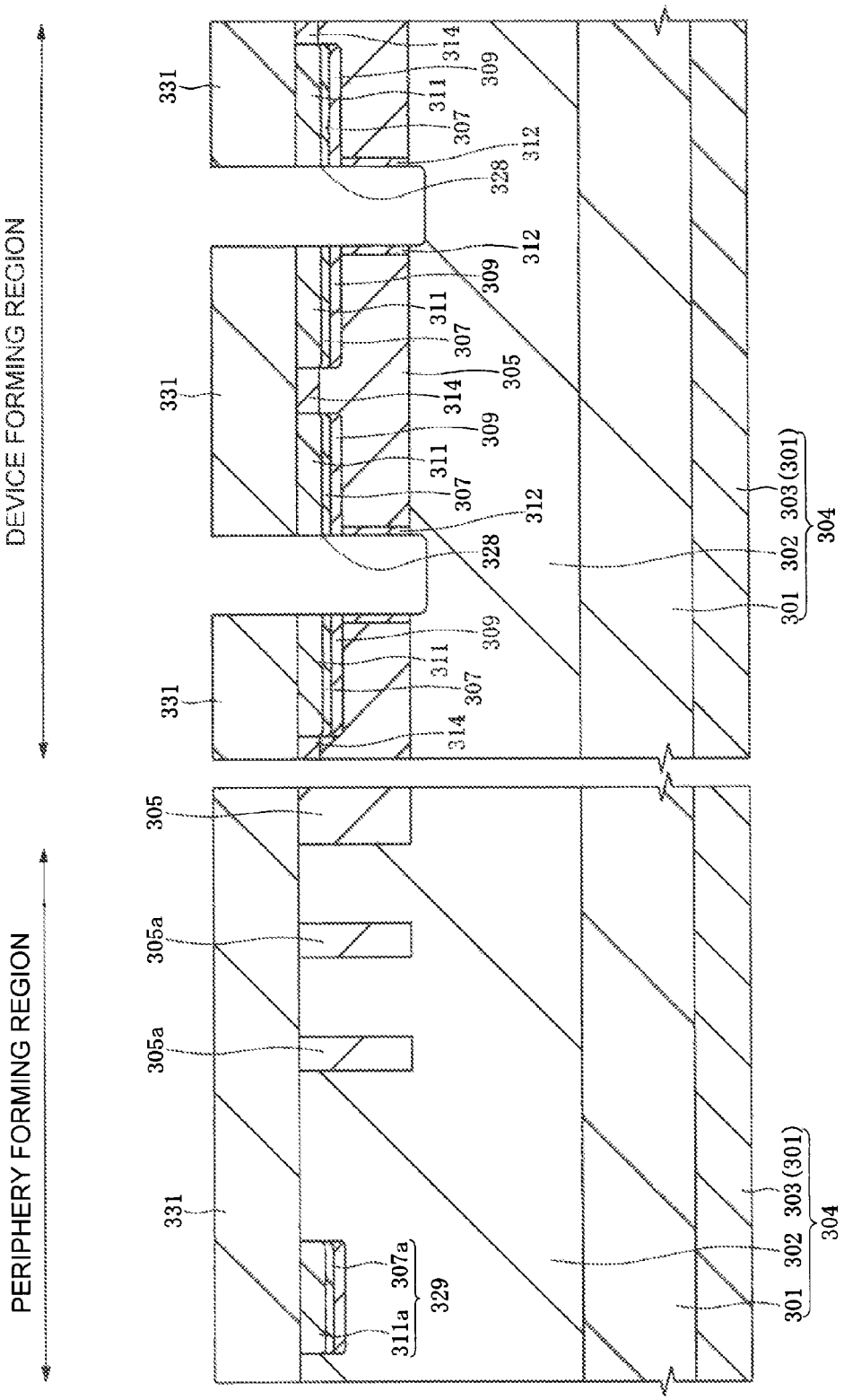
FIG. 30 is a cross-sectional view of a principal portion of the silicon carbide semiconductor device in the same place as in FIG. 26 in the process for producing the silicon carbide semiconductor device continued from FIG. 29.

Subsequently, as shown in FIG. 30, after the mask 330 is removed, a trench 328 is formed in the SiC epitaxial substrate 304 using the hard mask 331. The depth of the trench 328 depends on the depth of the p-type body layer 305, however, it is necessary to set the depth of the trench 328 larger than the depth (first depth) of the p-type body layer 305 from the surface of the epitaxial layer 302. By doing this, an end portion of the p-type body layer 305 is located on a side surface of the trench 328.

Subsequently, while leaving the hard mask 331, an $n^-$-type, intrinsic, or $p^-$-type channel region (second channel region) 312 is formed. In the case of forming an $n^-$-type channel region 312, by obliquely ion-implanting an n-type impurity into the $n^-$-type epitaxial layer 302 over the hard mask 331, the $n^-$-type channel region 312 is formed on a side surface of the trench 328 where the p-type body layer 305 is formed on the $n^-$-type epitaxial layer 302. As the n-type impurity, a nitrogen atom (N) or a phosphorus atom (P) can be used. The implantation angle is desirably about 10 to 45 degrees with respect to the normal line of the $n^+$-type SiC substrate 301. The depth of the $n^-$-type channel region 312 from the side surface of the $n^-$-type trench 328 is, for example, about 0.05 to 0.2 μm. The impurity concentration in the $n^-$-type channel region 312 is, for example, in a range from $1\times10^{16}$ to $1\times10^{19}$ $cm^{-3}$.

Figure 31:
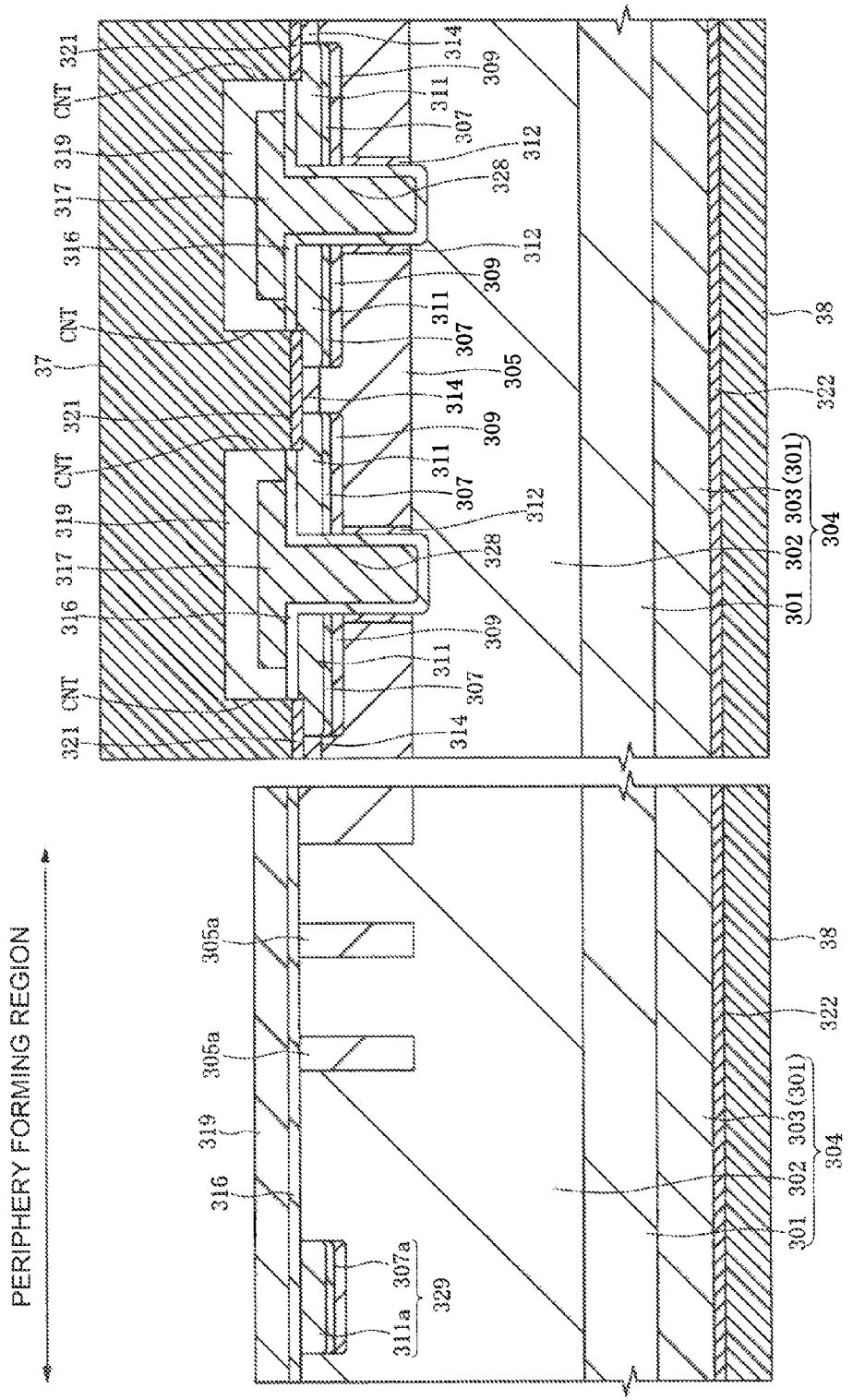
FIG. 31 is a cross-sectional view of a principal portion of the silicon carbide semiconductor device in the same place as in FIG. 26 in the process for producing the silicon carbide semiconductor device continued from FIG. 30.

Thereafter, as shown in FIG. 31, in the same manner as in the first embodiment described above, a gate insulating film 316, a gate electrode 317, etc. are formed in the device forming region. Subsequently, an interlayer insulating film 319 is formed on a surface of the $n^-$-type epitaxial layer 302, and thereafter, an opening CNT is formed in a desired region in the interlayer insulating film 319, and then, a metal silicide layer 321 is formed on the respective surfaces of the part of the $n^{++}$-type source region 311 and the $p^{++}$-type potential fixing layer 314 exposed on a bottom surface of the opening CWT.

Subsequently, a metal silicide layer 322 is formed so as to cover the $n^+$-type drain region 303 formed on the back surface side of the $n^+$-type SiC substrate 301, and then, a drain wiring electrode 38 is formed so as to cover the metal silicide layer 322.

Subsequently, an opening (not shown) that reaches the gate electrode 317 is formed in the interlayer insulating film 319, and then, a source wiring electrode 37 that is electrically connected to a part of the $n^{++}$-type source region 311 through the metal silicide layer 321, and a gate wiring electrode (not shown) that is electrically connected to the gate electrode 317 are formed.

In this manner, according to the third embodiment, since the channel region is constituted by the $n^-$-type, intrinsic, or $p^-$-type channel region 312 capable of realizing a high channel mobility and the $p^+$-type channel region 309 capable of realizing a high threshold voltage, both of a high channel mobility and a high threshold voltage can be realized even in the case of the SiC power MISFET having a trench structure.

Further, the source region is constituted by the $n^+$-type source region 307 and the $n^{++}$-type source region 311, the $n^+$-type source region 307 is formed between the $p^+$-type channel region 309 and the $n^{++}$-type source region 311, and the source wiring electrode 37 is connected to the $n^{++}$-type source region 311 through the metal silicide layer 321. According to this configuration, an electric field in the $p^+$-type channel region 309 in contact with the $n^+$-type source region 307 is relaxed, and therefore, the deterioration of the gate insulating film 316 can be suppressed, and also the contact resistance between the $n^{++}$-type source region 311 and the source wiring electrode 37 can be decreased.

Further, in the SiC power MISFET having a trench structure, a vertical surface of the 4H—SiC substrate having a higher channel mobility than a horizontal surface of the 4H—SiC substrate is used as the channel region. Accordingly, the channel resistance can be decreased.

Hereinabove, the present invention accomplished by the present inventors have been described in detail with reference to the embodiments, however, it goes without saying that the present invention is not limited to the embodiments described above, and can be modified variously within a range that does not depart from the gist of the present invention.

For example, the materials of the respective components, the conductivity types, the production conditions, etc. are not limited to those in the embodiments described above, and it goes without saying that a lot of modifications can be made. Here, for the sake of explanation, the description is made by fixing the conductivity types of the semiconductor substrates and the semiconductor films, however, the conductivity types are not limited to those in the embodiments described above.

INDUSTRIAL APPLICABILITY

The present invention can be applied to a power semiconductor device composed of silicon carbide, which has high pressure resistance and is used in high-current systems.

What is claimed is:

1. A silicon carbide semiconductor device, comprising:
a substrate of a first conductivity type composed of silicon carbide and having a first principal surface and a second principal surface which is an opposite surface to the first principal surface;
an epitaxial layer composed of silicon carbide and formed on the first principal surface of the substrate;
a body layer of a second conductivity type different from the first conductivity type formed in the epitaxial layer from a surface of the epitaxial layer;
a source region formed in the body layer from the surface of the epitaxial layer spaced apart from an end portion of the body layer;
a channel region formed in the body layer from the surface of the epitaxial layer between an end portion of the body layer and the source region;
a gate insulating film formed in contact with the channel region;
a gate electrode formed in contact with the gate insulating film; and
a drain region of the first conductivity type formed in the substrate from the second principal surface of the substrate, wherein
the source region includes:
a first source region of the first conductivity type; and
a second source region of the first conductivity type formed in contact with the first source region between an end portion of the body layer and the first source region spaced apart from the end portion of the body layer, and
the channel region includes;
a first channel region of the second conductivity type formed in contact with the second source region between an end portion of the body layer and the second source region spaced apart from the end portion of the body layer; and
a second channel region formed in contact with the first channel region between an end portion of the body layer and the first channel region.

2. The silicon carbide semiconductor device according to claim 1, wherein an impurity concentration in the second source region is lower than an impurity concentration in the first source region.

3. The silicon carbide semiconductor device according to claim 1, wherein a depth of the first source region from the surface of the epitaxial layer is larger than a depth of the second source region from the surface of the epitaxial layer.

4. The silicon carbide semiconductor device according to claim 1, wherein the second channel region exhibits conductivity of the second conductivity type, and an impurity concentration in the second channel region is lower than an impurity concentration in the first channel region.

5. The silicon carbide semiconductor device according to claim 4, wherein a maximum impurity concentration in the first channel region is twice or more higher than a maximum impurity concentration in the second channel region.

6. The silicon carbide semiconductor device according to claim 1, wherein the second channel region exhibits intrinsic conductivity or conductivity of the first conductivity type.

7. The silicon carbide semiconductor device according to claim 1, wherein an ion species ion-implanted into the first source region is different from an ion species ion-implanted into the second source region.

8. The silicon carbide semiconductor device according to claim 1, wherein the first channel region is formed by obliquely ion-implanting an impurity.

9. The silicon carbide semiconductor device according to claim 1, wherein the device further comprises a guard ring of the first conductivity type in an outer peripheral portion of the epitaxial layer, and an impurity concentration distribution in the source region and an impurity concentration distribution in the guard ring are the same as each other.

\* \* \* \* \*

UNITED STATES PATENT AND TRADEMARK OFFICE
CERTIFICATE OF CORRECTION

| | |
|---|---|
| PATENT NO. | : 8,872,193 B2 |
| APPLICATION NO. | : 13/890315 |
| DATED | : October 28, 2014 |
| INVENTOR(S) | : Naoki Tega, Digh Hisamoto and Takashi Takahama |

It is certified that error appears in the above-identified patent and that said Letters Patent is hereby corrected as shown below:

On the Title Page

In Item (72), the second inventor's residence should read -- Kokubunji, (JP) --.

Signed and Sealed this
Twenty-first Day of February, 2017

Michelle K. Lee
*Director of the United States Patent and Trademark Office*